(12) United States Patent
Tatsuta

(10) Patent No.: US 9,596,758 B2
(45) Date of Patent: Mar. 14, 2017

(54) PATTERN FORMING METHOD, ELECTRONIC WIRING SUBSTRATE, AND OPTICAL DEVICE

(71) Applicant: FUJIFILM Corporation, Tokyo (JP)

(72) Inventor: Takeichi Tatsuta, Ashigara-kami-gun (JP)

(73) Assignee: FUJIFILM CORPORATION, Tokyo (JP)

( * ) Notice: Subject to any disclaimer, the term of this patent is extended or adjusted under 35 U.S.C. 154(b) by 8 days.

(21) Appl. No.: 14/665,455

(22) Filed: Mar. 23, 2015

(65) Prior Publication Data

US 2015/0201491 A1 Jul. 16, 2015

Related U.S. Application Data

(63) Continuation of application No. PCT/JP2013/068608, filed on Jul. 8, 2013.

(30) Foreign Application Priority Data

Sep. 26, 2012 (JP) ................. 2012-211762

(51) Int. Cl.
*H05K 3/12* (2006.01)
*B05D 5/00* (2006.01)
(Continued)

(52) U.S. Cl.
CPC ............... *H05K 1/092* (2013.01); *B41J 2/01* (2013.01); *H05K 1/0274* (2013.01);
(Continued)

(58) Field of Classification Search
CPC ......... B05D 5/00; H05K 3/1208; H05K 3/125
See application file for complete search history.

(56) References Cited

U.S. PATENT DOCUMENTS 8,398,227 B2  3/2013  Akedo et al.
9,190,273 B2 * 11/2015  Miyamoto ........ H01L 29/78636
(Continued)

FOREIGN PATENT DOCUMENTS

CN   1886033 A    12/2006
EP   1737284 A2   12/2006
(Continued)

OTHER PUBLICATIONS

International Search Report; PCT/JP2013/068608; Oct. 8, 2013.
(Continued)

*Primary Examiner* — James M Mellott
(74) *Attorney, Agent, or Firm* — Studebaker & Brackett PC

(57) ABSTRACT

A pattern forming method of ejecting inks in the form of droplets to a base material including a first region and a second region which differ from each other in terms of surface energy by an ink jet method, includes: a preparation step of preparing the base material including the first region and the second region; and a droplet ejection step of simultaneously ejecting a first ink and a second ink in the form of droplets to the first region and the second region respectively by using a multipass method, wherein the inks are at least two kinds of inks including the first ink having volatility and the second ink having curability, the first ink and the first region are lyophilic, and the second ink and the second region are lyophilic.

17 Claims, 15 Drawing Sheets

(51) Int. Cl.
*H05K 1/09* (2006.01)
*B41J 2/01* (2006.01)
*H05K 1/02* (2006.01)

(52) U.S. Cl.
CPC ............... *H05K 3/125* (2013.01); *B05D 5/00* (2013.01); *B41J 2202/04* (2013.01); *H05K 1/0287* (2013.01); *H05K 3/1208* (2013.01); *H05K 2201/09272* (2013.01); *H05K 2201/09681* (2013.01); *H05K 2203/013* (2013.01); *H05K 2203/0545* (2013.01); *H05K 2203/1173* (2013.01)

(56) References Cited

U.S. PATENT DOCUMENTS

| | | | |
|---|---|---|---|
| 9,193,180 B2* | 11/2015 | Miyamoto | .......... H01L 27/1292 |
| 2006/0292496 A1 | 12/2006 | Furukawa et al. | |
| 2008/0311285 A1 | 12/2008 | Hirai et al. | |
| 2008/0317943 A1 | 12/2008 | Hirai | |
| 2010/0181571 A1 | 7/2010 | Tano et al. | |

FOREIGN PATENT DOCUMENTS

| | | | | |
|---|---|---|---|---|
| JP | 2004-098017 A | | | 4/2004 |
| JP | 2000498017 A | * | | 4/2004 |
| JP | 2009-006229 A | | | 1/2009 |
| JP | 2009006229 A | * | | 1/2009 |
| JP | 2009-026899 A | | | 2/2009 |
| JP | 2009-026901 A | | | 2/2009 |
| JP | 4575725 B2 | | | 8/2010 |
| JP | 2012-025116 A | | | 2/2012 |
| WO | 2009/072603 A1 | | | 6/2009 |

OTHER PUBLICATIONS

The First Office Action issued by the Chinese Patent Office on Mar. 21, 2015, which corresponds to Chinese Patent Application No. 201380049991.6 and is related to U.S. Appl. No. 14/665,455; with English language translation.

The extended European search report issued by the European Patent Office on May 17, 2016, which corresponds to European Patent Application No. 13841885.0-1803 and is related to U.S. Appl. No. 14/665,455.

Notification of Transmittal of Translation of the International Preliminary Report on Patentability (Chapter I) and Translation of Written Opinion of the International Searching Authority; PCT/JP2013/068608 issued on Apr. 9, 2015.

An Office Action; "Notification of Reasons for Refusal," issued by the Japanese Patent Office on Jul. 7, 2015, which corresponds to Japanese Patent Application No. 2012-211762 and is related to U.S. Appl. No. 14/665,455; with English language translation.

The First Office Action issued by the Chinese Patent Office on Nov. 23, 2015, which corresponds to Chinese Patent Application No. 201380049991.6 and is related to U.S. Appl. No. 14/665,455; with English language translation.

An Office Action issued by the Korean Patent Office on Jul. 13, 2016, which corresponds to Korean Patent Application No. 10-2015-7007762 and is related to U.S. Appl. No. 14/665,455; with partial English language translation.

* cited by examiner

PATTERN FORMING METHOD, ELECTRONIC WIRING SUBSTRATE, AND OPTICAL DEVICE

CROSS-REFERENCE TO RELATED APPLICATIONS

This application is a Continuation of PCT International Application No. PCT/JP2013/068608 filed on Jul. 8, 2013, which claims priority under 35 U.S.C. §119(a) to Japanese Application No. 2012-211762 filed on Sep. 26, 2012. Each of the above application(s) is hereby expressly incorporated by reference, in its entirety, into the present application.

BACKGROUND OF THE INVENTION

The present invention relates to a pattern forming method and a pattern forming apparatus for forming patterns of electronic wiring, printed wiring boards, electrodes for semiconductors, electronic devices, display devices, optical devices, signage, ornaments, and the like by using an ink jet method. Particularly, the present invention relates to a pattern forming method and a pattern forming apparatus that can form a pattern having a line width smaller than 100 μm at a high aspect ratio, and relates to an electronic wiring substrate and an optical device formed by the pattern forming method.

In recent years, techniques for forming patterns such as wiring pattern of electronic circuits, electronic wiring patterns on substrates have drawn attention. For forming such patterns, for example, a liquid ejection head for ink jet system (ink jet head) is used. In this case, a liquid in which metal particles or resin particles are dispersed is ejected in the form of droplets from the liquid ejection head (ink jet head) so as to draw a pattern, the droplets are hardened by heating and the like, and thus an electronic wiring pattern is formed.

JP 4575725 B (Patent Literature 1) discloses a method in which a pattern having wettability is formed in modified polyimide according to a desired wiring pattern to be drawn by means of ultraviolet exposure such that the modified polyimide exhibits difference of surface energy, and to the resultant, a conductive ink is ejected in the form of droplets by inkjet so as to form wiring or an electrode.

WO 2009/072603 (Patent Literature 2) describes a pattern drawing method in which an ejection target region in a substrate is irradiated with a laser or infrared so as to preheat the ejection target region, and a liquid is ejected in the form of droplets to the ejection target region by using an ink jet method. According to the method, the liquid droplets that have just ejected to the ejection target region are rapidly solidified, spreading of liquid droplets resulting from wetting of the substrate is inhibited, and at the same time, nozzle clogging is inhibited by the heating of the substrate.

SUMMARY OF THE INVENTION

When a pattern is formed by using an ink jet method, due to the characteristics of the inkjet method, a liquid (hereinafter, referred to as an "ink") having low viscosity of several mPa·s to tens of mPa·s is generally used. Accordingly, after ejected to a base material, the ink droplets spread due to wetting. For this reason, the ink jet method is a printing method that makes it difficult to increase the thickness of the ink relative to the area of the drawing surface. For instance, for screen printing, an ink having viscosity of thousands of mPa·s is used, and consequentially, the thickness of a line can be about 100 μm relative to a line width of 50 μm. In contrast, if drawn by a general ink jet method, the line has a thickness of about 1 μm to 2 μm.

In a case in which a thick pattern is required, such as printing of decorative patterns or Braille by using an ink jet, a UV ink jet method using a UV curable resin as a binder, a hot melt ink jet method in which an ink of which viscosity increases as temperature decreases is used and ejected in a heated state from an ink jet head portion, or the like has been used. However, in these methods, ink droplets are superimposed on dots of which viscosity has increased, and accordingly, the ink flows down toward the bottom. As a result, under generally required conditions for productivity, the thickness of the line can only become about several μm relative to a line width of 50 μm. Furthermore, because these methods use a considerable amount of a thermoplastic resin or a UV curable resin as a binder, they cannot be applied to the applications in which such resins cannot be used, for example, the application in which conductive fine particles or semiconductor fine particles are desired to be printed as a functional member.

If the method of Patent Literature 1 is used, it is possible to define a region, in which lines will be drawn, based on wettability of the base material and to draw high-quality lines. However, the document does not disclose any means for drawing a thick line.

According to Patent Literature 2, the ejection target region of the substrate needs to be irradiated beforehand with a laser or infrared rays, and thus energy efficiency thereof is poor. Moreover, in Patent Literature 2, if the ink droplets are simultaneously ejected from many nozzles by an ink jet method so as to improve productivity, the irradiation of the ejection target region in the substrate with the laser or infrared rays and the ejection of the liquid droplets should be repeated rapidly, and this makes it difficult to improve productivity.

A first object of the present invention is to provide a pattern forming method and a pattern forming apparatus that make it possible to easily form a thick pattern, particularly, a pattern having a thickness of equal to or greater than 20% of a width of a region of the pattern by using an ink jet method, for the applications in which a resin is not used or used only in a small amount as a binder, such as the application in which a pattern is particularly formed of a conductive material, a semiconducting material, or an optical functional material.

A second object of the present invention is to provide a pattern forming method and a pattern forming apparatus that make it possible to form wiring having a current capacity sufficient for the application by utilizing an ink jet method and particularly using a conductive material.

A third object of the present invention is to provide an electronic wiring substrate and an optical device that are formed by using the pattern forming method.

In order to achieve the aforementioned objects, according to a first aspect of present invention, there is provided a pattern forming method of ejecting inks in the form of droplets to a base material by an ink jet method, comprising:

a droplet ejection step of simultaneously ejecting a first ink and a second ink in the form of droplets to a first region and a second region respectively by using a multipass method, wherein the inks are at least two kinds of inks including the first ink having volatility and the second ink having curability, the base material includes the first region and the second region which differ from each other in terms of surface energy, the first ink and the first region are lyophilic, and the second ink and the second region are lyophilic.

In the present invention, if inks are simultaneously ejected in the form of droplets, for example, it means that a first ink and a second ink are ejected in the form of droplets before one pass is completed. When the inks are simultaneously ejected in the form of droplets, the first ink and the second ink are ejected in the form of droplets preferably within 1 second, more preferably within 0.5 seconds, and particularly preferably within 0.2 seconds.

For example, the first ink is an ink containing metal particles, and the second ink is an ultraviolet curable ink or a thermosetting ink.

It is preferable for the first ink and the second ink to repel each other.

Provided that a width of a narrowest portion of a pattern formed by a first film formed of the first ink and a second film formed of the second ink is p (m), a surface tension of the first ink is $\sigma_1$ (N/m), a film thickness of the first ink is $\delta_1$ (m), and a Hamaker constant determined by the base material and the first ink is $a_{H1}$ (J), it is preferable for the first ink to satisfy $\sigma_1 > 0.153 p^{1.947} \times \delta_1^{3.84} \times |a_{H1}|^{1.022}$.

Provided that a width of a narrowest portion of a pattern formed by a first film formed of the first ink and a second film formed of the second ink is p (m), a surface tension of the second ink is $\sigma_2$ (N/m), a film thickness of the second ink is $\delta_2$ (m), and a Hamaker constant determined by the base material and the second ink is $a_{H2}$ (J), it is preferable for the second ink to satisfy $\sigma_2 > 0.153 p^{1.947} \times \delta_2^{-3.84} \times |a_{H2}|^{1.022}$.

It is preferable that in the droplet ejection step, the droplets of the second ink are cured by performing curing processing on the droplets of the second ink which are ejected before one pass ends.

It is preferable for the first ink to be ejected in the form of droplets to a region between regions to which the second ink is ejected in the form of droplets and cured.

It is preferable that in the droplet ejection step, the first ink is ejected in the form of droplets, in an amount not less than 5 times an ejection amount in which the droplets of the first ink are ejected at an interval equal to the diameter of each of the first ink droplets.

The first film formed of the first ink has a height of, for example, equal to or greater than 4 μm.

For example, the first ink forms a conductive film, and the second ink forms an insulating film.

It is preferable for the pattern forming method to further include a step of forming a film by ejecting the second ink in the form of droplets to the entire surface of the first ink and the second ink.

It is preferable that the first region has at least a first straight line group consisting of a plurality of first straight lines that extend in a first direction in a state of being parallel to each other and a second straight line group consisting of a plurality of second straight lines that extend in a second direction in a state of being parallel to each other, and grid shapes are formed of the first straight line group and the second straight line group.

It is preferable for the first region to further have a third straight line group consisting of a plurality of third straight lines that extends toward the second straight lines from the first straight lines and is in a position of a diagonal line of each of the grid shapes.

It is preferable for the first region to further have a fourth straight line group consisting of a plurality of fourth straight lines that extends in a position of a diagonal line other than the position of the diagonal line of the third straight lines.

It is preferable that the first straight line group and the second straight line group have first division lines and second division lines respectively that are formed of the plurality of first straight lines and the plurality of second straight lines arranged on the same axis, and a gap between the first straight lines forming the first division lines is identical to a gap between the second straight lines forming the second division lines.

It is preferable that at least one of the first straight line group and the second straight line group forms an aggregation in which the first straight lines or the second straight lines extending in a state of being parallel to each other are arranged close together, and a clearance between the first straight lines or the second straight lines forming the aggregation is equal to or less than a diameter of a dot formed by ejection of the first ink, and a clearance between the aggregations adjacent to each other is greater than the diameter of the dot formed by the ejection of the first ink.

According to a second aspect of the present invention, there is provided an electronic wiring substrate comprising wiring formed by the pattern forming method of the present invention.

According to a third aspect of the present invention, there is provided an optical device formed by the pattern forming method of the present invention.

According to a fourth aspect of the present invention, there is provided a pattern forming apparatus that forms a pattern by ejecting inks in the form of droplets to a base material by using an ink jet method, comprising:

an ejection portion that can simultaneously eject at least two kinds of inks including a first ink having volatility and a second ink having curability in the form of droplets, wherein the base material has a first region and a second region which differ from each other in terms of surface energy, the first ink and the first region are lyophilic, and the second ink and the second region are lyophilic, and the ejection portion simultaneously ejects the first ink and the second ink in the form of droplets to the first region and the second region of the base material respectively by using a multipass method while performing scanning.

It is preferable that in the ejection portion, first nozzles ejecting the first ink and second nozzles ejecting the second ink are arranged in the scanning direction of the ejection portion, and a curing portion that performs curing processing on the droplets of the second ink is disposed in a position adjacent to the second nozzles.

According to the present invention, it is possible to easily form a thick pattern, particularly, a pattern having a thickness equal to or greater than 20% of a width of a region of the pattern by using an ink jet method without a laser or the like, for the application in which a resin is not used or used only in a small amount as a binder, such as the application in which a pattern is particularly formed of a conductive material, a semiconducting material, or an optical functional material. Needless to say, according to the present invention, a thin pattern can also be formed.

Moreover, according to the present invention, it is possible to form wiring having current capacity sufficient for the application by utilizing an ink jet method and particularly using a conductive material.

Furthermore, according to the present invention, it is possible to form an electronic wiring substrate and an optical device by using the pattern forming method.

DETAILED DESCRIPTION OF THE INVENTION

Hereinafter, based on preferable embodiments illustrated in the attached drawings, a pattern forming method, an electronic wiring substrate, an optical device, and a pattern forming apparatus of the present invention will be specifically described.

Figure 1:
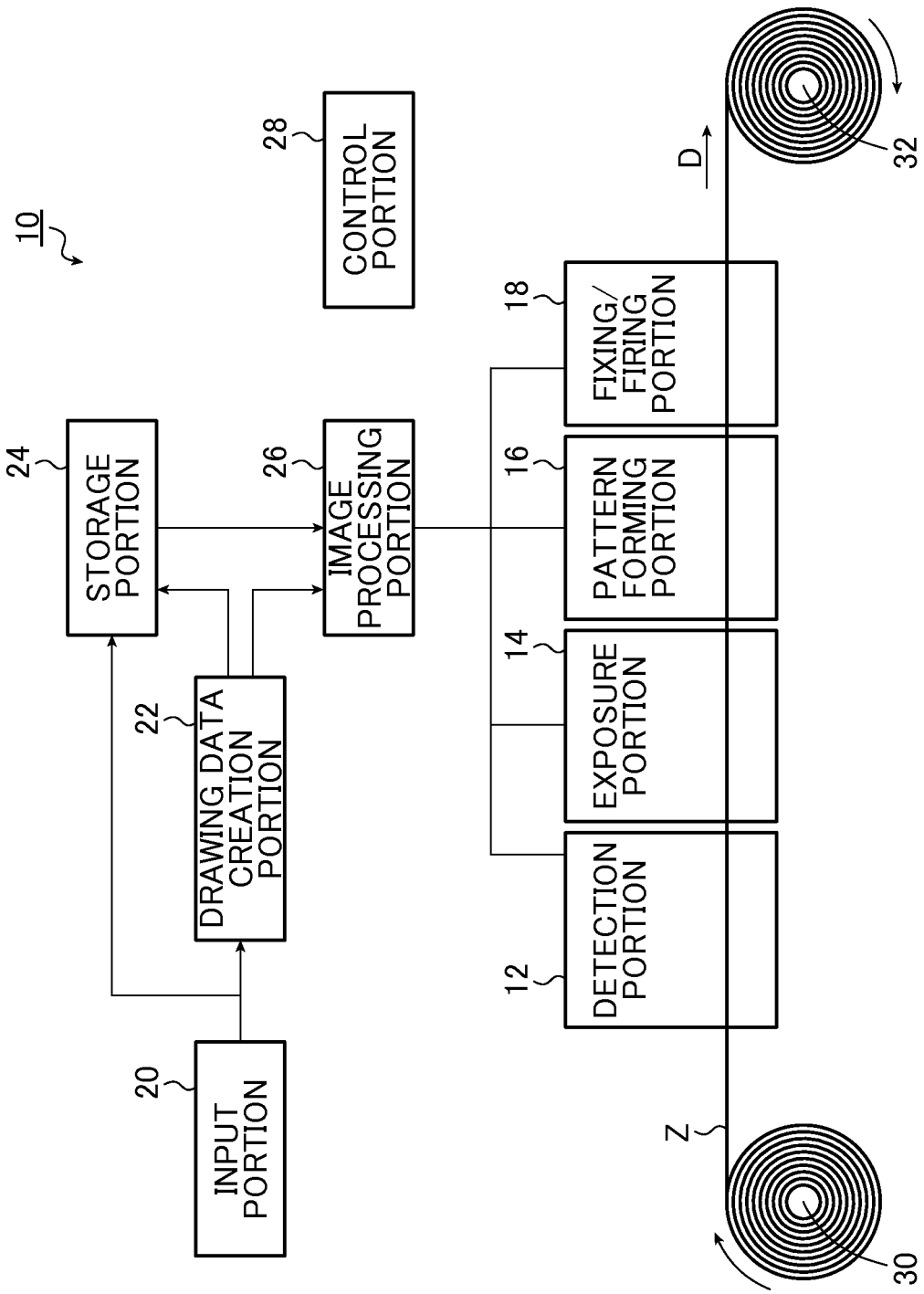
FIG. 1 is a schematic view showing an example of a pattern forming apparatus used in a pattern forming method of an embodiment of the present invention.
Figure 2A:
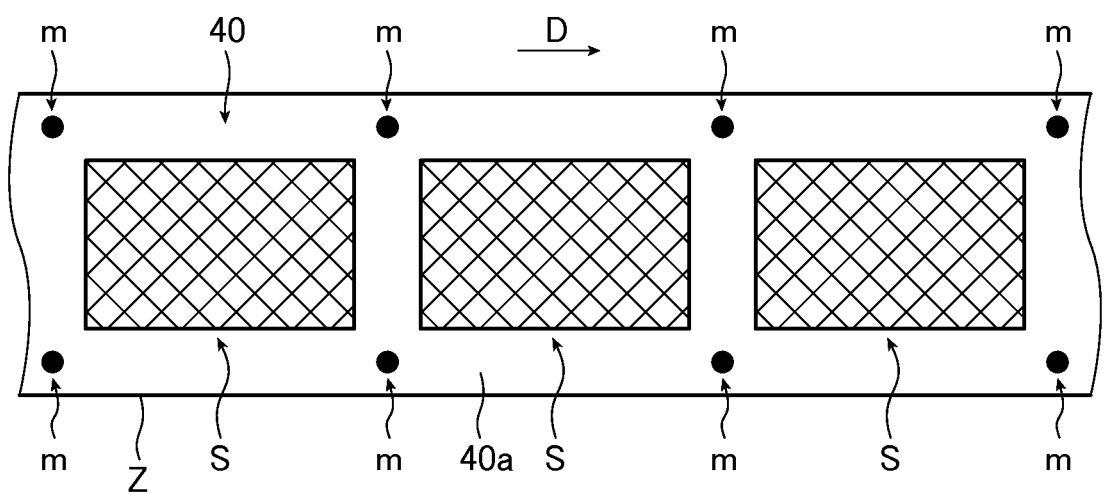
FIG. 2A is a schematic plan view showing a substrate which is used in the pattern forming method of an embodiment of the present invention and in which a lyophilic-lyophobic conversion film is formed.
Figure 2B:
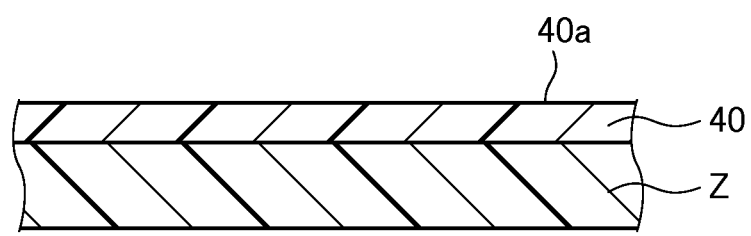
FIG. 2B is a schematic cross-sectional view showing the substrate which is used in the pattern forming method and in which the lyophilic-lyophobic conversion film is formed.

FIG. 1 is a schematic view showing an example of a pattern forming apparatus used in the pattern forming method of an embodiment of the present invention. FIG. 2A is a schematic plan view showing a substrate which is used in the pattern forming method of an embodiment of the present invention and in which a lyophilic-lyophobic conversion film is formed, and FIG. 2B is a schematic cross-sectional view showing the substrate which is used for the pattern forming method and in which the lyophilic-lyophobic conversion film is formed.

A pattern forming apparatus 10 shown in FIG. 1 (hereinafter, simply referred to as a "forming apparatus 10") is, for example, a roll-to-roll type device that performs various processing while transporting a substrate Z in a longitudinal direction. The forming apparatus 10 forms a pattern. For example, by the forming apparatus 10, patterns of electronic wiring, printed wiring boards, electrodes for semiconductors, electronic devices, display devices, optical devices, signage, ornaments, and the like, and wiring patterns of electronic wiring substrates are formed by using an ink jet method.

The forming apparatus 10 includes a detection portion 12, an exposure portion 14, a pattern forming portion 16, and a fixing/firing portion 18.

The forming apparatus 10 also includes an input portion 20, a drawing data creation portion 22, a storage portion 24, an image processing portion 26, and a control portion 28. By the control portion 28, the operation of each of the portions constituting the forming apparatus 10 is controlled.

In the forming apparatus 10, the substrate Z is wound in the form of a roll around a rotating shaft 30. The rotating shaft 30 continuously sends the substrate Z, and, for example, a motor (not shown in the drawing) is connected to the rotating shaft 30. By the motor, the substrate Z is continuously sent in a transport direction D.

The forming apparatus 10 also includes a winding-up shaft 32 around which the substrate Z having passed through the detection portion 12, the exposure portion 14, the pattern forming portion 16, and the fixing/firing portion 18 is wound up. For example, a motor (not shown in the drawing) is connected to the winding-up shaft 32. By the motor, the winding-up shaft 32 is rotated, and the substrate Z is wound up in the form of a roll around the winding-up shaft 32. In this way, the substrate Z is transported in the transport direction D.

As shown in FIG. 2B, in the substrate Z, a lyophilic-lyophobic conversion film 40 having a lyophilic-lyophobic conversion function is formed. The lyophilic-lyophobic conversion film 40 is constituted with a liquid repellent agent. The liquid repellent agent has a function that by light having a predetermined wavelength, for example, ultraviolet light (UV light), the surface energy of the liquid repellent agent is changed, and the degree of lyophilic properties thereof is changed. For example, by ultraviolet light (UV light), the lyophilic-lyophobic conversion film 40 is patterned to have regions having different surface energies in at least two or more stages. Furthermore, when the lyophilic-lyophobic conversion film 40 is irradiated with ultraviolet light (UV light), the film thickness thereof is reduced.

As shown in FIG. 2A, on a surface 40a of the lyophilic-lyophobic conversion film 40, alignment marks m are formed in four corners of the outer periphery of a rectangular forming region S. By using the substrate Z, a hydrophilic-hydrophobic pattern is formed, and then a pattern is formed.

Herein, if the substrate Z has a lyophilic-lyophobic conversion function, the lyophilic-lyophobic conversion film 40 is not necessarily formed in the substrate Z.

Hereinafter, the substrate Z will be specifically described.

The forming apparatus 10 of the present embodiment is a roll-to-roll type device. Therefore, from the viewpoint of productivity, flexibility, and the like, as the substrate Z, a resin film is used. For this reason, the substrate Z is also referred to as a "base material." The resin film is not particularly limited, and the material, shape, structure, thickness, and the like thereof can be appropriately selected from among known ones.

Examples of the resin film include polyester-based resin films such as polyethylene terephthalate (PET), polyethylene naphthalate (PEN), and modified polyester, polyolefin-based resin films such as a polyethylene (PE) resin film, a polypropylene (PP) resin film, a polystyrene resin film, and a cyclic olefin-based resin, vinyl-based resin films such as polyvinyl chloride and polyvinylidene chloride, a polyether ether ketone (PEEK) resin film, a polysulfone (PSF) resin film, a polyether sulfone (PES) resin film, a polycarbonate (PC) resin film, a polyamide resin film, a polyimide resin film, an acryl resin film, a triacetyl cellulose (TAC) resin film, and the like.

When a pattern applied to a display, such as an optical pattern of an optical device, is formed by the forming apparatus 10, a transparent resin film is preferable as the substrate Z, and light transmittance of the resin film at a wavelength of a visible region is preferably equal to or greater than 80%. Particularly, in view of transparency, heat resistance, handleability, strength, and cost, a biaxially oriented polyethylene terephthalate film, a biaxially oriented polyethylene naphthalate film, a polyether sulfone film, and a polycarbonate film are preferable, and a biaxially oriented polyethylene terephthalate film and a biaxially oriented polyethylene naphthalate film are more preferable.

The forming apparatus 10 may be a sheet-fed type device, and in this case, as the substrate Z, various materials such as a Si wafer, quartz glass, glass, plastic, and metal plate can be used. The materials are not particularly limited as long as a semiconductor film, a metal film, a dielectric film, an organic film and the like can be formed on the substrate surface by lamination.

As the substrate, it is possible to use a substance in which various films such as a semiconductor film, a metal film, a dielectric film, and an organic film, a film formed of a functional material, and a functional element are formed on the surface of a substrate.

Next, specific examples of the liquid repellent agent constituting the lyophilic-lyophobic conversion film 40 will be described. As described above, the lyophilic-lyophobic conversion film 40 functions as a material having a lyophilic-lyophobic conversion function and is constituted with the liquid repellent agent. The thickness (film thickness) of the lyophilic-lyophobic conversion film 40 is preferably 0.001 µm to 1 µm, and particularly preferably 0.01 µm to 0.1 µm.

In the lyophilic-lyophobic conversion film 40, there is a difference in lyophilic properties between a portion having not been subjected to energy irradiation and a portion having been subjected to energy irradiation, and the portion having been subjected to energy irradiation is more lyophilic. The portion having been subjected to energy irradiation is referred to as a pattern forming region (a first region), and a region other than this region is referred to as a non-pattern forming region (a second region). The non-pattern forming region repels liquid.

Furthermore, in the lyophilic-lyophobic conversion film 40, the film thickness of the portion having been subjected to energy irradiation (pattern forming region) is reduced by, for example, 10 nm, hence there is a step difference between the portion having not been subjected to energy irradiation (non-pattern forming region) and the portion having been subjected to energy irradiation (pattern forming region). If the film thickness is reduced by 3 nm, that is, if the step difference is 3 nm, a pattern forming effect which will be described later is obtained. Consequentially, the film thickness is preferably reduced by about 3 nm to 10 nm, and the step difference is about 3 nm to 10 nm. If the lyophilic-lyophobic conversion film 40 is a monomer, it shrinks about 10% when being polymerized by ultraviolet irradiation, and thus the film thickness is reduced. If the lyophilic-lyophobic conversion film 40 is a polymer, it shrinks about 10% when being partially decomposed by ultraviolet irradiation, and thus the film thickness is reduced.

In the present embodiment, the film thickness, the step difference of the film, the reduction in the film thickness, and the like can be measured by various known measurement methods. Examples of the measurement methods include a method of capturing a cross-sectional photograph or a cross-sectional image and measuring the aforementioned items from the cross-sectional photograph or the cross-sectional image, a method of measuring a position to an interface by using a spectroscopic microscope, a method of peeling a portion of the film and mechanically measuring the step difference, a method of peeling a portion of the film and measuring the step difference by using an AFM (atomic force microscope), and the like.

Examples of the inorganic material constituting the liquid repellent agent include oxides such as titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$). One, two, or more kinds of these oxides can be selected and used. For example, titanium dioxide includes an anatase-type and a rutile-type, and any of them can be used. However, it is preferable to use anatase-type titanium dioxide.

As a binder constituting the liquid repellent agent, it is preferable to use a compound having strong bond energy that prevents the main skeleton thereof from being decomposed by photoexcitation of the oxide. In order to make the binder to perform a function of changing wettability by the action of the oxide, it is preferable to use a compound which has strong bond energy preventing the main skeleton of the binder from being decomposed by photoexcitation of the oxide and has an organic substituent decomposed by the action of the oxide. Examples of the binder include organopolysiloxane which exerts great strength by hydrolysis and polycondensation of chlorosilane or alkoxysilane by means of a sol-gel reaction or the like, organopolysiloxane crosslinked with reactive silicone having excellent water repellency and oil repellency, and the like.

Moreover, in addition to the organopolysiloxane, a stable organosilicon compound such as dimethylpolysiloxane which does not cause a crosslinking reaction may be mixed with the binder.

Furthermore, a decomposable substance, which is decomposed by the action of the oxide by energy irradiation and thus can change wettability of the surface of an oxide-containing layer, can be contained in the oxide-containing layer. Examples of such a decomposable substance include surfactants that are decomposed by the action of the oxide and perform a function of changing the wettability of the surface of a photocatalyst-containing layer by being decomposed as above.

Specific examples of the surfactants include fluorine- or silicone-based nonionic surfactants. Furthermore, cationic surfactants, anionic surfactants, and amphoteric surfactants can also be used. In addition to the surfactants, for example, oligomers, polymers, and the like such as polyvinyl alcohol, unsaturated polyester, an acryl resin, polyethylene, diallyl phthalate, an ethylene-propylene-diene monomer, an epoxy resin, a phenol resin, polyurethane, a melamine resin, polycarbonate, polyvinyl chloride, polyamide, polyimide, styrene butadiene rubber, chloroprene rubber, polypropylene, polybutyrene, polystyrene, polyvinyl acetate, nylon, polyester, polybutadiene, polybenzimidazole, polyacrylonitrile, epichlorohydrin, polysulfide, and polyisoprene can be used.

In addition, examples of compounds imparting lyophilic property include onium salts such as a diazonium salt, a sulfonium salt, and an iodonium salt, an o-nitrobenzylsulfonate compound, a p-nitrobenzylsulfonate compound concurrently used with a sensitizer, a N-imidosulfonate compound, an oxime sulfonate compound, an α-ketosulfonate compound, a naphthoxydiazide-4-sulfonate compound, a diazodisulfone compound, a disulfone compound, a ketosulfone compound, an o-nitrobenzyl ester compound, a m-alkoxybenzylester compound, an o-nitrobenzylamide compound, a phenacyl ester compound, a 2,4-dinitrobenzene sulfonyl ester, a 2-diazo-1,3 diketone compound, a phenol ester compound, an o-nitrobenzylphenol compound, a 2,5-cyclohexadienone compound, a sulfonated polyolefin, an aryl diazosulfonate salt, and the like.

The detection portion 12 obtains positional information of the alignment marks m by detecting the alignment marks m, and is connected to the image processing portion 26. The detection portion 12 includes a strain sensor (not shown in the drawing) and an alignment detection portion (not shown in the drawing).

The strain sensor detects the alignment marks m by using light having a wavelength that does not change the lyophilic and lyophobic properties of the lyophilic-lyophobic conversion film 40. For example, as the strain sensor, an optical strain sensor including a light source such as LED and an imaging element such as CMOS or CCD is used. When the visualizing ink reflects or absorbs light having a wavelength of equal to or greater than 500 nm, as the light source, a light source radiating light having a wavelength of equal to or greater than 500 nm is used. Specifically, as the wavelength of the light source, for example, 633 nm, 660 nm, 590 nm or infrared (IR) is used.

In the strain sensor, the alignment marks m are irradiated with light having a wavelength of equal to or greater than 500 nm, the alignment marks m, which are formed beforehand in four corners of the outer periphery of the forming region S shown in FIG. 2A, are imaged, and in this way, for example, image data of four alignment marks m is obtained. The image data of four alignment marks m is output in the form of a group to the alignment detection portion.

Based on the image data of each of the alignment marks m obtained by the strain sensor, the alignment detection portion calculates, for example, the position of the each of the alignment marks m, the size and direction of the alignment marks m, and the distance between the alignment marks m, and compares the results with designed values of the size, arrangement position, and the like of the alignment marks m, thereby creating strain information on the substrate Z (positional information of the alignment marks m). The strain information on the substrate Z includes, for example, the direction in which the substrate Z expands and contracts and the degree of expansion and contraction of the substrate Z. Specifically, the strain information on the substrate Z includes the direction in which the forming region S surrounded by the four alignment marks m expands and contracts, the degree of expansion and contraction of the forming region S, the rotation direction of the forming region S, the degree of rotation of the forming region S, the degree of expansion and contraction from the predetermined size of the forming region S, and the degree of trapezoidal strain and the like. The strain information on the substrate Z is output to the image processing portion 26. As described later, in the image processing portion 26, based on the strain information on the substrate Z, corrective data for exposure (corrective exposure data) and corrective data for droplet ejection (corrective data for droplet ejection pattern) are created.

The alignment marks m can be imaged using the strain sensor by any method without particular limitation. Examples of the method include a method in which the strain sensor images the alignment marks m of the fixed substrate Z while being two-dimensionally moved, a method in which the alignment marks m of the substrate Z are imaged while the substrate Z is being moved, and the like.

The patterns formed by the pattern forming method include, for example, wiring of electronic circuits, portions constituting an electronic element such as TFT, precursors of wiring of electronic circuits or portions constituting an electronic element such as TFT, wiring patterns of electronic wiring substrates, and optical patterns of optical devices.

The exposure portion 14 performs processing of making the pattern forming region lyophilic (hereinafter, simply referred to as a "lyophilic processing") in the lyophilic-lyophobic conversion film 40 formed on the substrate Z. By the exposure portion 14, the lyophilic-lyophobic conversion film 40 is patterned to have a pattern forming region and a non-pattern forming region. By the lyophilic processing, the film thickness of the pattern forming region of the lyophilic-lyophobic conversion film 40 is reduced by about 3 nm to 10 nm. The exposure portion 14 includes an exposure unit (not shown in the drawing) and a gas supply unit (not shown in the drawing), and is connected to the image processing portion 26.

Herein, "making the pattern forming region lyophilic" is a process of creating a state in which the contact angle of the liquid droplets with respect to the lyophilic-lyophobic conversion film 40 is relatively small. That is, it is a process of creating a state in which the difference of liquid repellency arises.

In the exposure portion 14, the lyophilic-lyophobic conversion film 40 is patterned to have regions having different surface energies in at least two or more stages.

The exposure unit is a unit which irradiates, for example, the pattern forming region to be a pattern with light that can make the lyophilic-lyophobic conversion film 40 lyophilic (exposes the pattern forming region to the light) within the surface 40a of the lyophilic-lyophobic conversion film 40 of the substrate Z. As alight source of the exposure unit, for example, a light source that can radiate light of an ultraviolet region having a wavelength of 300 (nm), 365 (nm), 405 (nm), or the like can be used. Moreover, a laser light source can also be used.

In the exposure unit, the output of ultraviolet light is, for example, 1 (mJ/cm$^2$) to hundreds of (mJ/cm$^2$). Herein, depending on the composition of the substrate, if the output of ultraviolet light is high, the substrate may be altered. Therefore, as long as the lyophilic-lyophobic conversion film 40 can become lyophilic, it is preferable for the output of ultraviolet light to be low.

As the exposure unit, an exposure unit employing digital exposure method using a laser beam and an exposure unit employing a mask exposure method can be used.

In the digital exposure method, based on pattern data of a pattern to be formed that is output from the image processing portion 26, the pattern forming region is subjected to the lyophilic processing by being irradiated with a laser beam. At this time, the pattern forming region becomes lyophilic, and the film thickness is reduced and accordingly, a step difference is made between the pattern forming region and the non-pattern forming region.

When an exposure unit employing a digital exposure method is used as the exposure unit, for example, the exposure unit is caused to scan the lyophilic-lyophobic conversion film 40 in a direction orthogonal to the transport direction D of the substrate Z, and within the pattern forming region, a region which can be exposed to light by being scanned once in the direction is subjected to the lyophilic processing. After the lyophilic processing performed once in the scanning direction ends, the substrate Z is moved by a predetermined amount in the transport direction D, and the lyophilic processing is performed on the next region within the same pattern forming region. It is possible to use a serial method in which the lyophilic processing is performed on the entire pattern forming region by repeating the above operation.

Furthermore, a scanning optical portion using a laser beam (not shown in the drawing) may be provided in the exposure unit, such that the laser beam is caused to scan the lyophilic-lyophobic conversion film 40 without causing the exposure unit to perform the scanning in the lyophilic processing.

Moreover, the exposure unit may be an array type that can radiate a plurality of laser beams in a width direction orthogonal to the transport direction D of the substrate Z.

In the mask exposure method, in a state in which a photomask for forming a predetermined pattern is disposed on the substrate Z, ultraviolet light is radiated from the exposure unit so as to perform the lyophilic processing, whereby a lyophilic pattern forming region is formed.

At the time of light irradiation, the gas supply unit supplies reactant gas which is for making the pattern forming region of the substrate Z lyophilic if necessary. By the gas supply unit, the concentration (filling amount) of the reactant gas in the substrate Z, supply timing, and the like are adjusted. As the reactant gas, for example, gas containing oxygen or nitrogen is used.

Herein, if the lyophilic-lyophobic conversion film 40 can be subjected to the lyophilic processing simply by being irradiated with ultraviolet light, the gas supply unit is not necessarily provided.

As described later, when the strain of the substrate Z exceeds an allowable range, the exposure portion 14 performs patterning to form a pattern forming region and a non-pattern forming region by using the corrective exposure data.

When the lyophilic-lyophobic conversion film 40, in which a lyophilic pattern forming region is formed by the lyophilic processing performed beforehand, is used, the lyophilic processing by the exposure portion 14 is not necessary. In this case, the exposure portion 14 is not necessarily provided in the pattern forming apparatus.

The pattern forming portion 16 ejects inks in the form of droplets to each of the pattern forming region and the non-pattern forming region simultaneously by using an ink jet method, and thus forms predetermined films. For example, the pattern forming portion forms a conductive film in the pattern forming region and forms an insulating film in the non-pattern forming region.

Figure 3A:
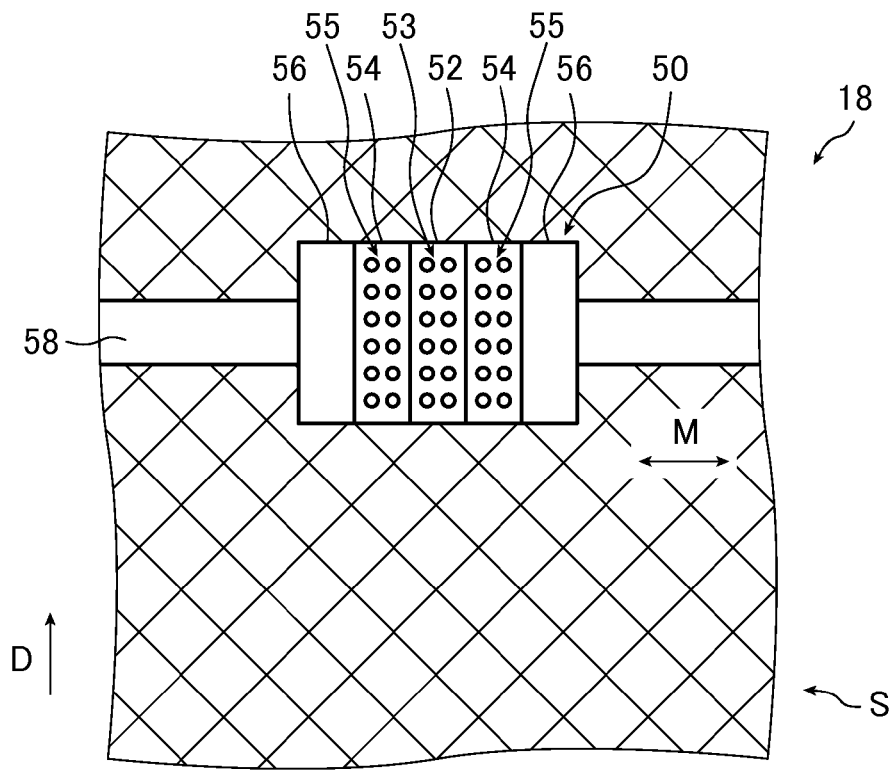
FIG. 3A is a schematic plan view showing the constitution of a pattern forming portion of the pattern forming apparatus shown in FIG. 1.

As shown in FIG. 3A, in the pattern forming portion 16, a driving carriage 50 (ejection portion) is disposed in a sub-scanning direction M orthogonal to the transport direction D of the substrate Z, in a state of being able to be moved by a guide bar 58. In the driving carriage 50, a moving unit (not shown in the drawing) for moving the driving carriage 50 in the sub-scanning direction M is disposed. Herein, a main scanning direction is the transport direction D.

Figure 3B:
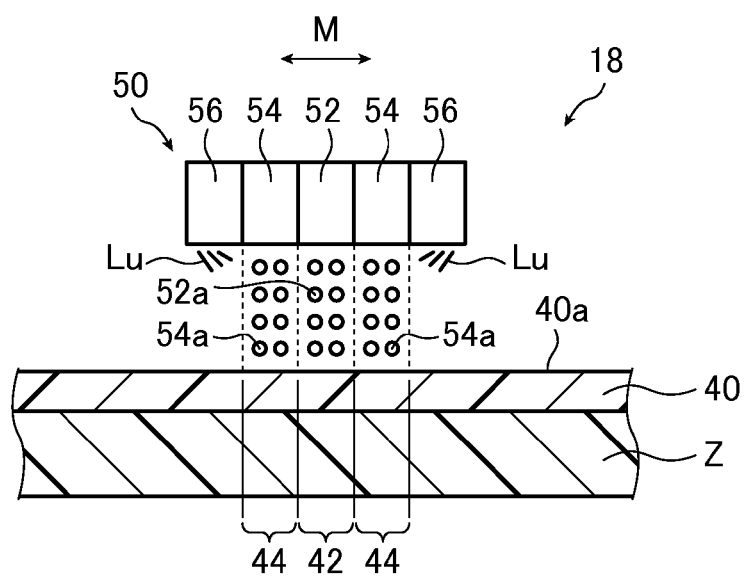
FIG. 3B is a schematic lateral view showing the constitution of the pattern forming portion of the pattern forming apparatus shown in FIG. 1.

As shown in FIGS. 3A and 3B, the driving carriage 50 includes a first ejection head 52, second ejection heads 54, and ultraviolet radiating lamps 56 (curing portions). In the driving carriage 50, the second ejection heads 54 are disposed at both sides of the first ejection head 52, and each of the second ejection heads 54 includes each of the ultraviolet radiating lamps 56. As the ultraviolet radiating lamps 56, for example, metal halide lamps are used.

Herein, the driving carriage 50 may include at least one first ejection head 52 and one second ejection head 54, and does not necessarily include the ultraviolet radiating lamps 56.

The first ejection head 52 includes a first nozzle array 53 ejecting a first ink having volatility. By ejecting the first ink to a pattern forming region 42 (a first region), the first ejection head 52 forms a film in the pattern forming region 42. The second ejection heads 54 include a second nozzle array 55 ejecting a second ink having curability. By ejecting the second ink to a non-pattern forming region 44 (a second region), the second ejection heads 54 form a film in the non-pattern forming region 44. From the first ejection head 52 and the second ejection heads 54, the first ink and the second ink are independently ejected in the form of droplets. Herein, the first ink and the pattern forming region 42 are lyophilic, and the second ink and the second region are lyophilic.

The ultraviolet radiating lamps 56 are for curing second ink droplets 54*a* ejected from the second ejection heads 54, and irradiate the second ink droplets 54*a* with ultraviolet light Lu. Herein, means for curing the second ink droplets 54*a* is not limited to the ultraviolet radiating lamps 56 as long as they can increase viscosity of the second ink droplets 54*a*. If the second ink is a UV curable ink, the second ink droplets 54*a* are irradiated with ultraviolet light. If the second ink 54*a* is a thermally cured or thermally dried ink, the second ink droplets 54*a* are heated by a platen heater, an IR heater, or the like so as to increase the viscosity thereof. Furthermore, the second ink droplets 54*a* may be irradiated with a laser beam so as to increase the viscosity thereof.

The pattern forming portion 16 can also form a film covering the pattern forming region and the non-pattern forming region. In this way, the function of the pattern forming portion 16 is not limited to the formation of a film to be a pattern.

In the pattern forming portion 16, the first ink and the second ink are ejected in the form of droplets by a multipass method.

Specifically, in the pattern forming portion 16, while the driving carriage 50 is being caused to perform shuttle scanning in the sub-scanning direction M in a predetermined pass number, the first ink is ejected in the form of droplets to the pattern forming region from the first ejection head 52, and at the same time, the second ink is ejected in the form of droplets to the non-pattern forming region from the second ejection heads 54.

At this time, before one pass ends, the second ink droplets 54*a* may be cured by being irradiated with ultraviolet light by the ultraviolet radiating lamps 56 (hereinafter, the irradiation of ultraviolet light will be simply referred to as "UV exposure").

Herein, the multipass method is a method in which the driving carriage 50 is caused to perform scanning a plurality of times (a plurality of times of pass) in the sub-scanning direction M so as to complete the pattern in a predetermined region.

In forming the pattern, the pass number is preferably equal to or greater than 20, more preferably equal to or greater than 50, and even more preferably equal to or greater than 100.

Moreover, in order to further increase the film thickness of the pattern to be formed, after the pattern is formed once in a predetermined pass number, the same pattern superimposed thereon may be formed again. The number of patterns superimposed is not particularly limited. For example, the number of patterns superimposed is set such that a required thickness is obtained.

In the present embodiment, considering spreading due to wetting, it is preferable for the ink droplets to be ejected at an optimal interval. It is preferable for the ink droplets to be ejected at an interval approximately equal to or less than the diameter of a single ink droplet spreading when being ejected to the respective regions. In this way, a first ink droplet of the first ink spreads over the pattern forming region 42, and a second ink droplet of the second ink spreads over the non-pattern forming region 44.

In this case, the first ink is ejected in the form of droplets in a sufficient amount, for example, in an amount not less than 5 times the ejection amount in which the ink is ejected in the form of droplets at an interval equal to a dot diameter of an ink droplet having not yet been dried in a wet region. If the amount of the first ink is not less than 5 times the ejection amount, the first ink is ejected in the form of droplets without a void. The amount of the first ink may be not less than 10 times the ejection amount or may be 20 times the ejection amount.

Regarding the UV exposure, the exposure amount is set which satisfies the condition under which the ink droplets are irradiated at 1/pass number (m) to 1/(pass number m×overwriting number n) of the total irradiation amount of the second ink.

In the present invention, an ink refers to a substance forming a pattern that exhibits optical, electrical, mechanical, biological, and dynamic functions. As the main component of the ink, not only the materials for chromogenic purpose, such as a dye or a pigment, used for the ink defined in the field of so-called photography, but also nanosized metal particles, metal complex solutions, precursors of organic semiconductors, cells, optical functional particles, liquid crystal materials, and the like can be used.

Furthermore, the ink refers to a substance which contains a polymerization initiator for providing curing/drying characteristics, and a monomer, a thermoplastic resin, a thermosetting resin, an oligomer, or the like as a binder, and which has been adjusted in terms of physical properties such as viscosity and surface tension by using a solvent, a surfactant, a viscosity adjuster, or the like such that the substance can be ejected from an ink jet head.

The first ink is an ink having volatility. The volatility is a property in which a solvent contained in the ink is volatilized by natural drying, a drying processing, or the like.

As the first ink, for example, it is possible to use known polar solvent-based silver inks (such as Flowmetal SW-1020 from BANDO CHEMICAL INDUSTRIES, LTD, NPS-J from Harima Chemicals Group, Inc., and a silver ink from MITSUIBISHI PAPER MILLS LIMITED.), copper-based inks, color pigment inks (aqueous inks for PX printer from Seiko Epson Corp.), and the like.

In order to make the first ink into a film or the like or to cause the first ink to perform a predetermined function, if necessary, the ink is fired or sintered by heating or fired optically.

As the first ink, for example, the following metal particle-containing ink described in JP 4416080 B can be used.

The metal particle-containing ink is composed of (A) a dispersion which contains at least particles of a metal oxide or a metal hydroxide, (B) at least two components including a dispersion of particles of a metal oxide or a metal hydroxide and a solution containing a reductant, or (C) at least two components including a dispersion of particles of a metal oxide or a metal hydroxide and a solution of a base or a base precursor.

[1] Dispersion of Particles of Metal Oxide or Metal Hydroxide (A) Composition and Size of Particles of Metal Oxide or Metal Hydroxide.

Examples of the metal constituting the particles of the metal oxide or the metal hydroxide used in the present invention include Au, Ag, Cu, Pt, Pd, In, Ga, Sn, Ge, Sb, Pb, Zn, Bi, Fe, Ni, Co, Mn, Tl, Cr, V, Ru, Rh, Ir, Al, and the like. Among the oxides or hydroxides of these metals, oxides of Au, Ag, Cu, Pt, Pd, In, Ga, Sn, Ge, Sb, Pb, Zn, Bi, Fe, Ni, and Co are preferable. Particularly, oxides of Ag or Cu such as $Ag_2O$, $CuO$, $Cu_2O$, and the like are preferable since these are easily reduced and generate relatively stable metals. The mean crystallite size of these metal oxide particles is 1 nm to 100 nm and preferably 1 nm to 50 nm.

(a) Adsorptive Compound

As an adsorptive compound, a compound having a functional group such as —SH, —CN, —$NH_2$, —$SO_2OH$, —SOOH, —$OPO(OH)_2$, or —COOH is effective. Particularly, a —SH group-containing compound (such as dodecanethiole or L-cysteine) and a $NH_2$ group-containing compound (such as octylamine, dodecylamine, oleylamine, oleic acid amide, or lauric acid amide) are preferable. In the case of hydrophilic colloid, it is preferable to use an adsorptive compound having a hydrophilic group (such as —$SO_2M$ or —COOM (M represents a hydrogen atom, an alkali metal atom, an ammonium molecule, or the like)).

(b) Surfactant

As a surfactant, an anionic surfactant (such as sodium bis(2-ethylhexyl)sulfosuccinate and sodium dodecylbenzene sulfonate), a nonionic surfactant (such as an alkyl ester and alkyl phenyl ether of polyalkyl glycol), a fluorine-based surfactant, and the like can be used.

(c) Hydrophilic Polymer

As a hydrophilic polymer, for example, hydroxyethyl cellulose, polyvinyl pyrrolidone, polyvinyl alcohol, or polyethylene glycol may be contained in a colloidal dispersion.

(d) Addition Amount

The amount of the adsorptive compound, the surfactant, and/or the hydrophilic polymer added is preferably 0.01 times to 2 times the amount of the metal oxide particles in terms of mass ratio, and more preferably 0.1 times to 1 time the amount of the metal oxide particles in terms of mass ratio. The surface of the metal oxide particles is preferably covered with the adsorptive compound, the surfactant, and/or the hydrophilic polymer at a thickness of 0.1 nm to 10 nm. Herein, the surface does not need to be uniformly covered, and at least a portion of the surface of the metal oxide particles need to be covered.

Whether the surface of the metal oxide particles has been modified with an organic compound such as the adsorptive compound, the surfactant, or the hydrophilic polymer can be confirmed by observing a state in which the interval between the metal oxide particles is regular by using a high resolution TEM such as FE-TEM, or by chemical analysis.

(e) Solvent

Examples of a dispersion solvent (and a solvent of ink which will be described later) of the metal oxide or the metal hydroxide includes the following.

(1) Esters such as butyl acetate and cellosolve acetate (2) Ketones such as methyl ethyl ketone, cyclohexanone, methyl isobutyl ketone, and acetyl acetone (3) Chlorinated hydrocarbons such as dichloromethane, 1,2-dichloroethane, and chloroform (4) Amides such as dimethylformamide (5) Aliphatic hydrocarbons such as cyclohexanone, heptane, octane, isooctane, and decane (6) Aromatic hydrocarbons such as toluene and xylene (7) Ethers such as tetrahydrofuran, ethylether, and dioxane (8) Alcohols such as ethanol, n-propanol, isopropanol, n-butanol, diacetone alcohol, ethylene glycol, 2,5-hexanediol, 1,4-butanediol, cyclohexanol, cyclopentanol, and cyclohexenol (9) Fluorine-based solvents such as 2,2,3,3-tetrafluoropropanol

(10) Glycol ethers such as ethylene glycol monomethyl ether, ethylene glycol monoethyl ether, and propylene glycol monomethyl ether

(11) Alkylaminoalcohols such as 2-dimethylaminoethanol, 2-diethylaminoethanol, 2-dimethylaminoisopropanol, 3-diethylamino-1-propanol, 2-dimethylamino-2-methyl-1-propanol, 2-methylaminoethanol, and 4-dimethylamino-1-butanol

(12) Carboxylic acids such as butyric acid, isobutyric acid, 2-ethyl butyrate, pivalic acid, valeric acid, propionic acid, lactic acid, acrylic acid, methacrylic acid, propiolic acid, ethyl methyl acetate, and allyl acetate

(13) Amines such as diethylene triamine and ethylene diamine

(14) Water

Considering dispersion stability of the metal oxide or the metal hydroxide, solubility of the reductant, stability with respect to oxidation of the reductant, viscosity, and the like, one kind of these solvents can be used, or two or more kinds thereof can be used in combination. It is preferable to select a solvent (common solvent) which is excellent in dispersibility of the metal oxide or the metal hydroxide and in solubility of the reductant.

(C) Dispersion

The concentration of the particles of the metal oxide or the metal hydroxide in the dispersion is preferably 1% by mass to 80% by mass, and more preferably 5% by mass to 70% by mass when being expressed in terms of the metal. The dispersion may contain one kind of the particles of the metal oxide or the metal hydroxide or contain a plurality of kinds of particles of the metal oxide or the metal hydroxide. The valence of the metal in the particles of the metal oxide or the metal hydroxide may be a single valence or may be a mixture consisting of a plurality of valences. In addition, in order to regulate insulating properties/conductivity of the portion not being subjected to energy irradiation and the portion subjected to energy irradiation, inorganic particles such as SiO, $SiO_2$, and $TiO_2$ or a polymer (which may or may not be in the form of particles) may be used concurrently with the particles of the metal oxide or the metal hydroxide. Generally, the particle size of the particles of the metal oxide or the metal hydroxide in the dispersion is as small as being able to form colloid, but the particle size is not limited. The particle size is preferably 1 nm to 100 nm, and more preferably 1 nm to 50 nm.

[2] Ink

The aforementioned dispersion of the particles of the metal oxide or the metal hydroxide can be directly used as an ink. When it is difficult to cause a reduction reaction to the metal by using the aforementioned dispersion of the particles of the metal oxide or the metal hydroxide alone even if energy irradiation is performed, a reductant can be added to the dispersion.

The reductant used for reduction of the particles of the metal oxide or the metal hydroxide may be an inorganic reductant or an organic reductant. Examples of the inorganic reductant include $NaBH_4$, hydrazine, hydroxylamine, and the like. Examples of the organic reductant include (i) hydrazine-based compounds containing a hydrazine group (such as phenylhydrazine), (ii) amines such as p-phenylene diamine, ethylene diamine, and p-aminophenol, (iii) hydroxylamine-based compounds in which a nitrogen atom has been substituted with an acyl group, an alkoxycarbonyl group, or the like, (iv) amino alcohols such as 2-dimethylaminoethanol, 2-diethylaminoethanol, 2-aminoethanol, diethanolamine, and 2-amino-2-methyl-1-propanol, (v) diols such as hydroquinone, catechol, 1,4-butanediol, and ethylene glycol, (vi) an organic reductant represented by Formula $X—(A=B)_n—Y$ (herein, each of A and B represents a carbon atom or a nitrogen atom, each of X and Y represents an atomic group of which atoms having an unshared electron pair bind to A or B, and n represents 0 to 3) or a tautomer thereof, compounds that thermally generate these, and the like.

One kind of these reductants may be used singly, or a plurality of these reductants may be used in combination. However, because the reductants selectively reduce the metal oxide or the metal hydroxide, it is preferable to use them in combination as appropriate. Moreover, if necessary, each of the reductants may be used as an organic solvent.

As the atoms having an unshared electron pair that are contained in the compound (vi) represented by Formula $X—(A=B)_n—Y$, oxygen atoms, nitrogen atoms, sulfur atoms, phosphorus atoms, and the like are preferable, and oxygen atoms and nitrogen atoms are more preferable. As the atomic group X and Y containing these atoms, $OR_1$, $NR_1R_2$, $SR_1$, and $PR_1R_2$ are preferable (herein, each of $R_1$ and $R_2$ represents a hydrogen atom or a substituent). As the substituent, an alkyl group having 1 to 10 carbon atoms that may be substituted and an acyl group having 1 to 10 carbon atoms that may be substituted are preferable.

n is preferably 0 to 3, more preferably 0 to 2, and most preferably 0 or 1. When n is equal to or greater than 2, A and B may vary with each repeating unit. Furthermore, A and B, X and A, or Y and B may form a ring structure by binding to each other. When they form a ring structure, the ring is preferably a 5-membered ring or a 6-membered ring, and these rings may be condensed. When the rings are condensed, a 5- or 6-membered ring is preferable.

In the present invention, a reductant of which the electron conductivity is low after the reduction reaction is desirable. Specifically, an organic reductant, hydrazine, or hydroxylamine that does not leave residual metal ions is preferable. If a large amount of residues leaves after reduction, it exerts a negative influence on conductivity of wiring. Therefore, a reductant that leaves a small amount of residues is preferable, and particularly, a reductant that becomes volatile (sublimatable) after reduction or becomes volatile by decomposition is preferable.

From the same viewpoint, it is preferable for the reductant to be able to reduce the particles of the metal oxide or the metal hydroxide even when being used in a small amount. That is, it is preferable for the reductant to have a low molecular weight. Accordingly, the molecular weight of the reductant is preferably equal to or less than 500, more preferably equal to or less than 300, and most preferably equal to or less than 200.

Specific examples of reductants that can be used for reduction of the particles of the metal oxide or the metal hydroxide will be shown below, but the present invention is not limited to the examples.

[Chem. 1]

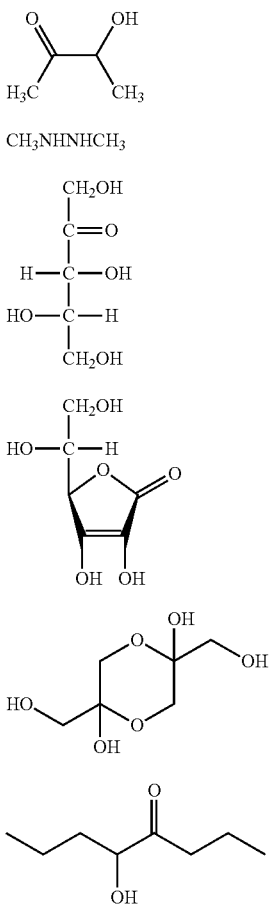

Examples of the case in which the particles of the metal oxide or the metal hydroxide are preferably combined with the reductant include (a) a case in which the particles of the metal oxide or the metal hydroxide and a reductant, which practically does not act to reduce the particles of the metal oxide or the metal hydroxide at normal temperature but potently acts as a reductant by energy irradiation, are contained in a single dispersion (one-component type ink) and (b) a case in which a dispersion (which may not contain a reductant) of the particles of the metal oxide or the metal hydroxide and a solution of a reductant (the reductant is required to perform potent reducing action at least by energy irradiation though the degree of the reducing action thereof at normal temperature is no object) that performs reducing action for the particles of the metal oxide or the metal hydroxide are separately prepared (two-component type ink).

In a case in which the reductant is combined with the metal oxide particles that are not easily reduced by only energy irradiation, or a case in which more potent reducing properties result from energy irradiation, a reducing action accelerator such as a base or a base precursor can be added beforehand to the dispersion of the metal oxide particles or the metal hydroxide particles or to another liquid (a reductant or a solution thereof). The base or the base precursor may perform reducing action.

As described above, as the reductant used in the present invention, a reductant is preferable which slowly reduces the particles of the metal oxide or the metal hydroxide at normal temperature but rapidly reduces the particles of the metal oxide or the metal hydroxide by energy irradiation. The temperature of heating performed by energy irradiation cannot be unconditionally specified because it depends on the irradiation time. Considering the heat resistance of the substrate or the element, the temperature at which heating is performed by thermal diffusion is preferably about equal to or less than 300° C., and more preferably about equal to or less than 250° C. Accordingly, it is preferable for the reductant to exhibit sufficient reducing properties with respect to the particles of the metal oxide or the metal hydroxide at a temperature of about equal to or less than 300° C. When a reductant which performs potent reducing action at room temperature is used for the (b) two-component type ink, the particles of the metal oxide or the metal hydroxide are reduced immediately after the reductant is mixed with the particles, and thus a metal is generated. Consequentially, needless to say, energy irradiation is not necessarily performed thereafter.

As described later, the dispersion of the particles of the metal oxide or the metal hydroxide, the reductant, or the mixture thereof is preferably used in the form of an ink for drawing a pattern by using an ink jet printer, a dispenser, or the like. Therefore, if necessary, a solvent is added thereto so as to adjust the viscosity thereof. The solvent usable for the ink is the same as described above.

If necessary, according to the purpose, various additives such as an antistatic agent, an antioxidant, a UV absorbent, a plasticizer, carbon nanoparticles, a dye, and a thermosetting resin such as a thermosetting phenol resin may be added to the dispersion of the particles of the metal oxide or the metal hydroxide and/or the reductant or the solution thereof.

When the dispersion of the particles of the metal oxide or the metal hydroxide, the reductant or the solution thereof, or the mixture of these is used in the form of an ink so as to draw a pattern by using an ink jet printer, a dispenser, or the like, the viscosity of the ink is important. If the viscosity of the ink is too high, the ink is not easily ejected from a nozzle, and if the viscosity of the ink is too low, bleeding of the drawn pattern may occur. Specifically, the viscosity of the ink is preferably 1 cP to 100 cP, and particularly preferably 5 cP to 30 cP. Moreover, the surface tension of the ink is desirably 25 mN/m to 80 mN/m, and particularly desirably 30 mN/m to 60 mN/m.

The second ink has curability. The curability is not limited and refers to characteristics in which the ink is cured by ultraviolet rays, heating, or the like.

As the second ink, for example, a UV curable ink, a thermosetting ink, or an ink obtained by dissolving the aforementioned inks in an organic solvent is used. Among these, the UV curable ink and the thermosetting ink are preferable, and the UV curable ink is more preferable. When the second ink is dissolved in an organic solvent, the solid content density thereof is preferably equal to or greater than 50% by volume, and more preferably equal to or greater than 75% by volume. As the second ink, for example, a Uvijet KO series manufactured by FUJIFILM Speciality Ink Systems Ltd., inks for cover lay (polyimide-based or UV-based) manufactured by JNC CORPORATION., and the like can be used.

It is preferable for the first ink and the second ink to repel each other, that is, repulsive to each other.

It is preferable that the first ink and the second ink are combined with each other such that when droplets of the two inks are brought into contact with each other, the interface therebetween is not disturbed while the second ink is undergoing change in physical properties (increase in viscosity). Generally, the above phenomenon is known as Marangoni effect and can be designed by calculating the Marangoni number from the function of surface tension.

In brief, when two liquids including the first ink and the second ink are put in a sufficient amount into a single container, if a clear interface is formed therebetween as in a case in which salad dressing is left standstill, the inks are regarded as being ideally combined.

Furthermore, when a container is filled with the second ink to a height of 1 cm, and then 1 μL of the first ink is quietly added dropwise (free fall) thereto from a capillary having a height of 1 cm, if the droplets of the first ink remain in the bottom surface of the container, the inks can be preferably used.

As described above, the first ink and the pattern forming region (first region) are lyophilic, and the second ink and the non-pattern forming region (second region) are lyophilic. At this time, the affinity of the first ink and the second ink with the pattern forming region and the non-pattern forming region and the pattern inductivity thereof are determined by using the Hamaker constant and are suitable for determining physical properties of the inks.

Figure 4:
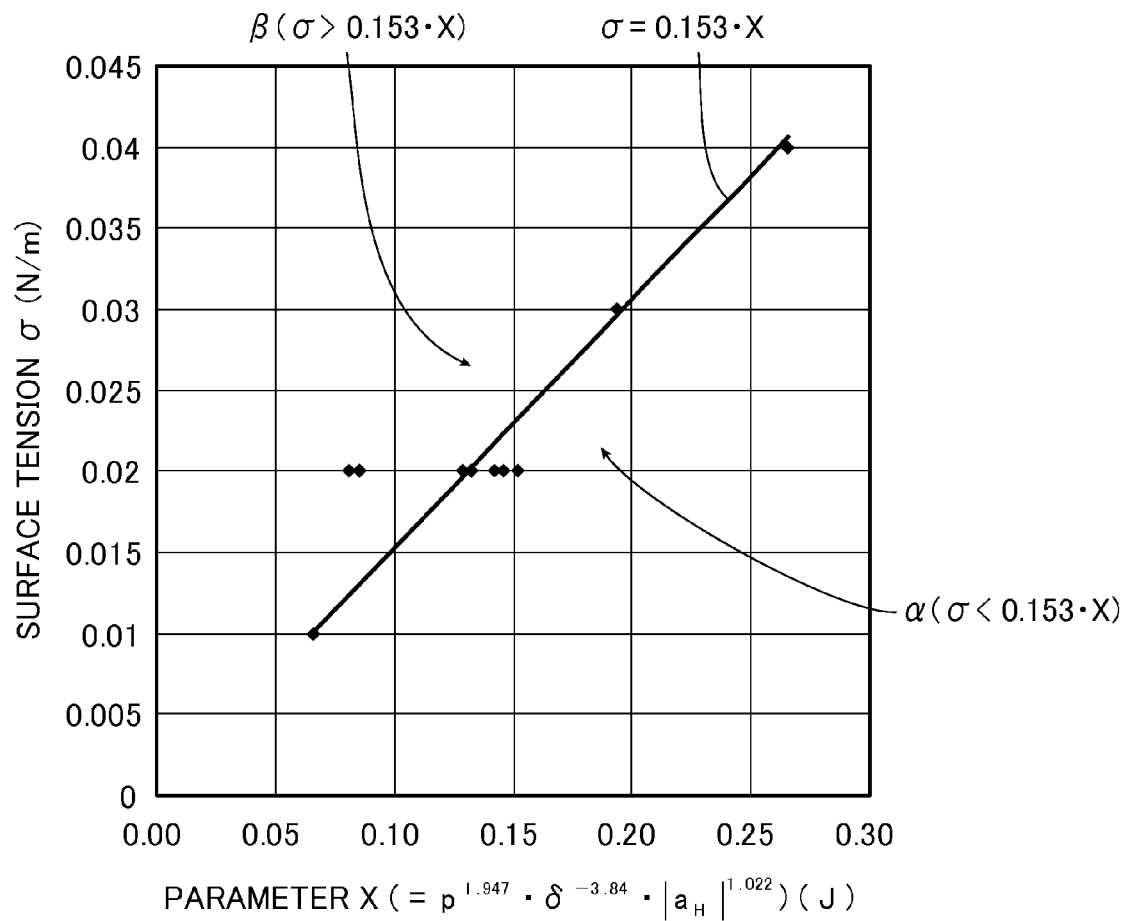
FIG. 4 is a graph for illustrating the relationship between surface tension and cissing.

In this case, provided that surface tension is $\sigma$ (N/m) and X indicates a parameter, as the first ink and the second ink, it is preferable to use inks satisfying a condition of $\sigma > 0.153 \cdot X$. FIG. 4 is a graph showing the relationship between the surface tension $\sigma$ and the parameter X, and the region $\beta$ shown in FIG. 4 is a region satisfying the condition of $\sigma > 0.153 \cdot X$. Herein, in the region $\alpha$ ($\sigma < 0.153 \cdot X$) shown in FIG. 4, cissing easily occurs.

Herein, provided that a film thickness is $\delta$ (m), a width of a narrowest portion of the pattern formed by a first film formed of the first ink and a second film formed of the second ink is p (m), and the Hamaker constant is $a_H$ (J), the parameter X is represented by $X = p^{1.947} \times \delta^{-3.84} \times |a_H|^{1.022}$. The coefficient 0.153 has a predetermined unit for converting the unit of the surface tension $\sigma$ (N/m) and the parameter X.

In the case of the general line-and-space pattern, between the width of the line and the width of the space, the width of narrower one corresponds to the width of the narrowest portion of the pattern. In contrast, in the case of the pattern having neck, the width of the neck is the width of the narrowest portion of the pattern. In the case of the circular or rectangular pattern, the diameter or short side thereof is the width of the narrowest portion of the pattern.

If the surface tension $\sigma$ satisfies the aforementioned condition ($\sigma > 0.153 p^{1.947} \times \delta^{-3.84} \times |a_H|^{1.022}$), it is more difficult for cissing to occur. Therefore, as the first ink and the second ink, it is preferable to use inks having the surface tension $\sigma$ corresponding to the region $\beta$.

Although the Hamaker constant $a_H$ (J) is determined by the upper film and the lower film, depending on the state of the lower film or the like, there may be a plurality of Hamaker constants in some cases. In this case, among the plurality of Hamaker constants, a negative number having a large absolute value has been known to control the phenomenon of cissing. This means that the overall outcome of the phenomenon of cissing is controlled by the physical properties of the lyophobic portion but is not greatly influenced by the change of the lyophilic portion. Consequentially, when there is a plurality of Hamaker constants, among these, a negative number having the largest absolute value is taken as the Hamaker constant $a_H$ (J) in the aforementioned parameter X.

In FIG. 4, the first ink and the second ink are collectively described. However, to be specific, regarding the first ink, provided that the surface tension of the first ink is $\sigma_1$ (N/m), the film thickness of the first ink is $\delta_1$ (m), and the Hamaker constant determined by the pattern forming region (base material) and the first film is $a_{H1}$ (J), it is preferable for the first ink to satisfy $\sigma_1 > 0.153 p^{1.947} \times \delta_1^{-3.84} \times |a_{H1}|^{1.022}$.

Regarding the second ink, provided that the surface tension of the second ink is $\sigma_2$ (N/m), the film thickness of the second ink is $\delta_2$ (m), and the Hamaker constant determined by the non-pattern forming region (base material) and the second film is $a_{H2}$ (J), it is preferable for the second ink to satisfy $\sigma_2 > 0.153 p^{1.947} \times \delta_2^{-3.84} \times |a_{H2}|^{1.022}$.

Herein, according to A. Sharma and G. Reiter (1996), the Hamaker constant is represented by the following Equation 1.

$$a_H = -12\pi d_0^2 S^d \quad \text{[Equation 1]}$$

In Equation 1, $d_0$ is a preset cutoff distance which is 0.158 nm. $S^d$ is represented by the following Equation 2, and $\gamma_L^d$ and $\gamma_S^d$ of the following Equation 2 are obtained by measuring a contact angle.

$$S^d = 2\sqrt{\gamma_L^d}(\sqrt{\gamma_S^d} - \sqrt{\gamma_L^d}) \quad \text{[Equation 2]}$$

Figure 5:
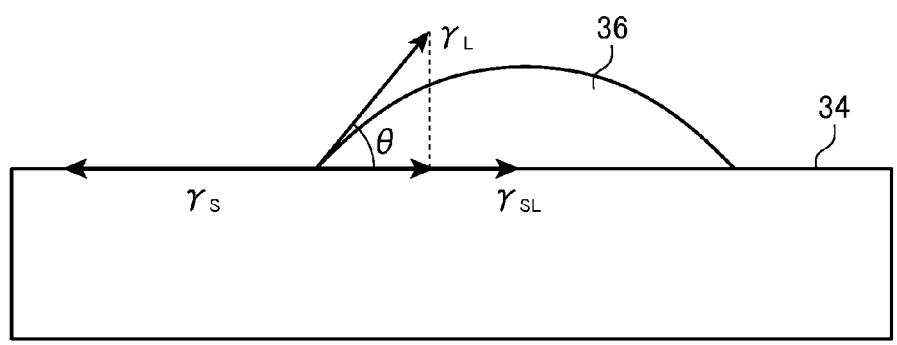
FIG. 5 is a schematic view for illustrating Young's equation.

As shown in FIG. 5, when a liquid droplet 36 is on the surface of a solid 34, and the liquid droplet 36 is in an equilibrium state, among the surface tension ($\gamma_S$) of the solid, the interfacial tension ($\gamma_{SL}$) between the solid and the liquid, and the surface tension ($\gamma_L$) of the liquid, the relationship of the Young's equation shown in the following Equation 3 is established. Herein, $\theta$ is a contact angle.

$$\gamma_L \cos \theta = \gamma_S - \gamma_{SL} \quad \text{[Equation 3]}$$

According to D. K. Owens and R. C. Wendt, J. Appl. Polym. Sci., 13, 1741 (1969), the following Equation 4 is obtained. From the following Equation 4, $\gamma_L^d$ and $\gamma_S^d$ can be obtained by measuring the contact angle $\theta$, and as a result, the Hamaker constant $a_H$ represented by Equation 1 can be obtained.

[Equation 4]

$$1 + \cos\theta = 2\sqrt{\gamma_S^d}\left(\frac{\sqrt{\gamma_L^d}}{\gamma_L}\right) + 2\sqrt{\gamma_S^h}\left(\frac{\sqrt{\gamma_L^h}}{\gamma_L}\right)$$

$\gamma_L^d$: dispersion force component of liquid side
$\gamma_S^d$: dispersion force component of solid side
$\gamma_L^h$: non-dispersion force component of liquid side
$\gamma_S^h$: non-dispersion force component of solid side As the ink jet method used in the pattern forming portion 16, a piezoelectric method, a thermal method, or the like can be appropriately used. Furthermore, as the ink jet head used in the ink jet method, a serial type or a full line type can be used.

Based on droplet ejection pattern data showing the position of the pattern forming region and the non-pattern forming region, the first ink is ejected in the form of droplets to the lyophilic pattern forming region, and the second ink is ejected in the form of droplets to the non-pattern forming region, thereby forming a pattern. The size of the ink droplets ejected from the ink jet head is about 16 μm to 30 μm.

Because the ink droplets are ejected based on the droplet ejection pattern data, if the droplet ejection pattern data is changed, the ejection position of the ink droplets can be easily changed.

As described later, when the strain of the substrate Z exceeds an allowable range, based on corrective droplet ejection pattern data, the first ink is ejected in the form of droplets to the pattern forming region, and the second ink is ejected in the form of droplets to the non-pattern forming region, thereby forming a pattern.

The fixing/firing portion 18 is a portion in which first ink droplets of the first ink and second ink droplets of the second ink are dried, or undergo sintering or the like such that a predetermined function, for example, conductivity is imparted to the droplets.

The input portion 20 includes an input device (not shown in the drawing) for enabling an operator (user) to perform various input operations and a display portion (not shown in the drawing). As the input device, various types of devices such as a keyboard, a mouse, a touch panel, and a button are used.

Through the input portion 20, the operator can input and store various processing conditions and operation conditions in the detection portion 12, the exposure portion 14, the pattern forming portion 16, and the fixing/firing portion 18 into the storage portion 24. Moreover, through the input portion 20, the operator can input and store pattern data (design data) including positional information (arrangement information) of the pattern to be formed and shape information such as the size of each of the constituent portions of the pattern, positional information of the alignment marks m of the substrate Z, and shape information such as the size of the alignment marks m into the storage portion 24.

Furthermore, through the display portion of the input portion 20, the operator can see the state of the detection portion 12, the exposure portion 14, the pattern forming portion 16 and the like. The display portion functions as a unit that displays a warning message such as an error message. In addition, the display portion functions as an alarm unit that reports abnormality.

The drawing data creation portion 22 converts the format of the pattern data input from the input portion 20, for example, CAD data including the positional information (arrangement information) of the pattern to be formed and the shape information such as the size of each of the constituent portions of the pattern such that the data can be used for irradiating the pattern forming region with UV light in the exposure portion 14, and creates exposure data usable in the exposure portion 14. In the exposure portion 14, based on the exposure data, the pattern forming region is irradiated with UV light.

In the drawing data creation portion 22, for example, the pattern data written in a vector format (vector data) is converted into a raster format (raster data). Herein, if the input data format is usable in the exposure portion 14, data conversion is not necessarily performed. In this case, the pattern data may be directly input into the image processing portion 26 without undergoing data conversion in the drawing data creation portion 22 or passing through the drawing data creation portion 22.

The storage portion 24 stores various information necessary for forming a pattern in the forming apparatus 10. For example, the information input into the forming apparatus 10 through the input portion 20 includes patterns of electronic wiring, printed wiring boards, electrodes for semiconductors, electronic devices, display devices, optical devices, signage, and ornaments, and wiring patterns of electronic wiring substrates. Moreover, the storage portion 24 also stores information regarding to which pattern data the strain information of the substrate created in the detection portion 12 corresponds in association with, for example, information regarding which constituent portion of the wiring pattern of the electronic wiring substrate and the optical pattern of the optical device has been prepared. The storage portion 24 also stores setting conditions, processing conditions, and the like of the respective constituent portions of the forming apparatus 10.

The image processing portion 26 is connected to the detection portion 12, the exposure portion 14, the pattern forming portion 16, the drawing data creation portion 22, and the storage portion 24. The strain information on the substrate Z created in the detection portion 12 is input into the image processing portion 26.

The image processing portion 26 is a portion for changing the position of the pattern to be formed on the lyophilic-lyophobic conversion film 40 based on the strain information on the substrate Z output from the detection portion 12, and thus functions as an adjusting portion for forming a pattern.

In the image processing portion 26, the strain information on the substrate Z is compared with an allowable range. When the strain of the substrate Z exceeds the allowable range, in order to change the radiation position of UV light according to the strain information on the substrate Z, the image processing portion 26 creates a corrective exposure data for correcting the exposure data.

When the exposure portion 14 is a digital exposure machine, based on the strain information on the substrate Z, the image processing portion 26 creates corrective exposure pattern data for correcting the pattern data showing the position of the pattern forming region. The corrective exposure pattern data is output to the exposure portion 14. In the exposure portion 14, based on the corrective exposure pattern data, the pattern forming region is irradiated with UV light, whereby the pattern forming region is made lyophilic. In this way, an appropriate position can be made lyophilic.

When a photomask is used, based on the strain information on the substrate Z, the image processing portion 26 creates the corrective exposure pattern data for correcting the position, the inclination, or the like of the photomask.

Moreover, in order to change the ink droplet ejection position according to the change in the exposure position, based on the strain information on the substrate Z, the image processing portion 26 creates the corrective droplet ejection pattern data for correcting the droplet ejection pattern data. The corrective droplet ejection pattern data is output to the pattern forming portion 16. In the pattern forming portion 16, based on the corrective droplet ejection pattern data, the first film is formed in the lyophilic pattern forming region, and the second film is formed in the non-pattern forming region. In this way, an appropriate pattern can be formed.

When the strain of the substrate Z is confirmed to be within the allowable range as a result of comparing the strain information on the substrate Z with the allowable range in the image processing portion 26, the corrective exposure data is not created. Accordingly, the exposure data input into the image processing portion 26 is directly output to the exposure portion 14 without being corrected. In the exposure portion 14, based on the exposure data, the pattern forming region is irradiated with UV light.

The forming apparatus 10 of the present embodiment is a roll-to-roll type device, but the present invention is not limited thereto. For example, the forming apparatus 10 may be a single sheet-fed type device that processes the substrate Z one by one.

In the pattern forming method of the present embodiment, for example, a pattern is formed in the following manner.

Figure 6A:
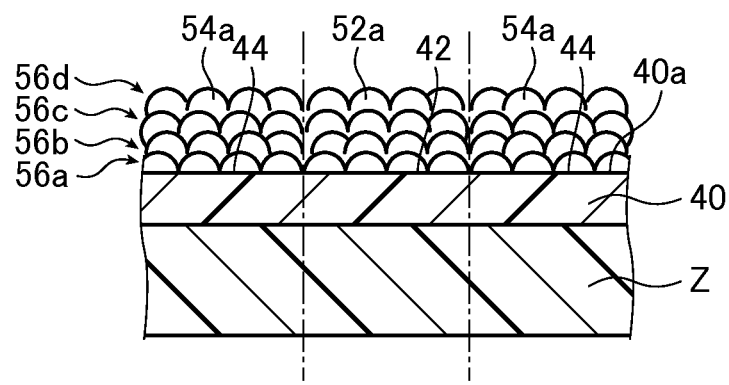
FIGS. 6A to 6C are schematic cross-sectional views showing the pattern forming method of an embodiment of the present invention in order of steps.
Figure 6B:
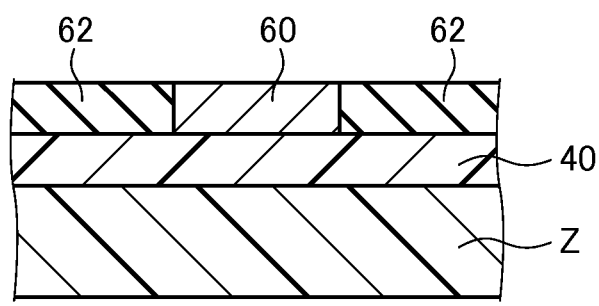
Figure 6C:
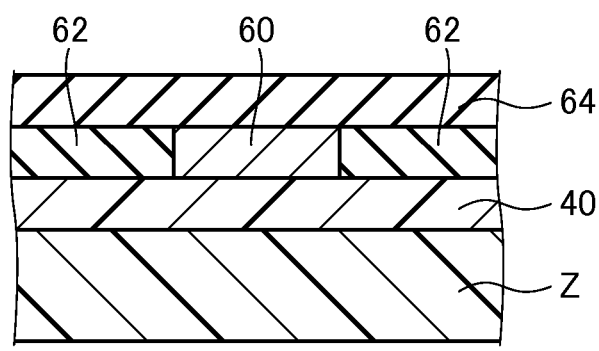
Figure 7:
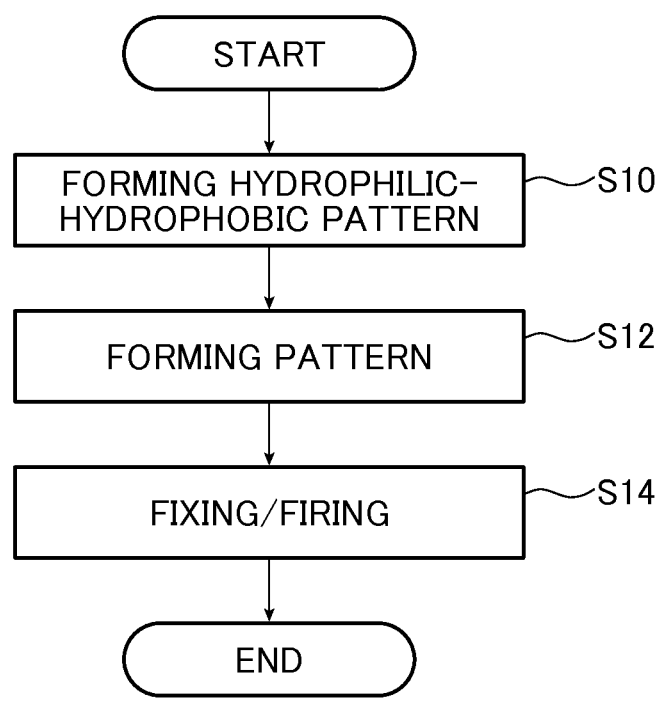
FIG. 7 is a flowchart showing the pattern forming method of an embodiment of the present invention in order of steps.
Figure 8:
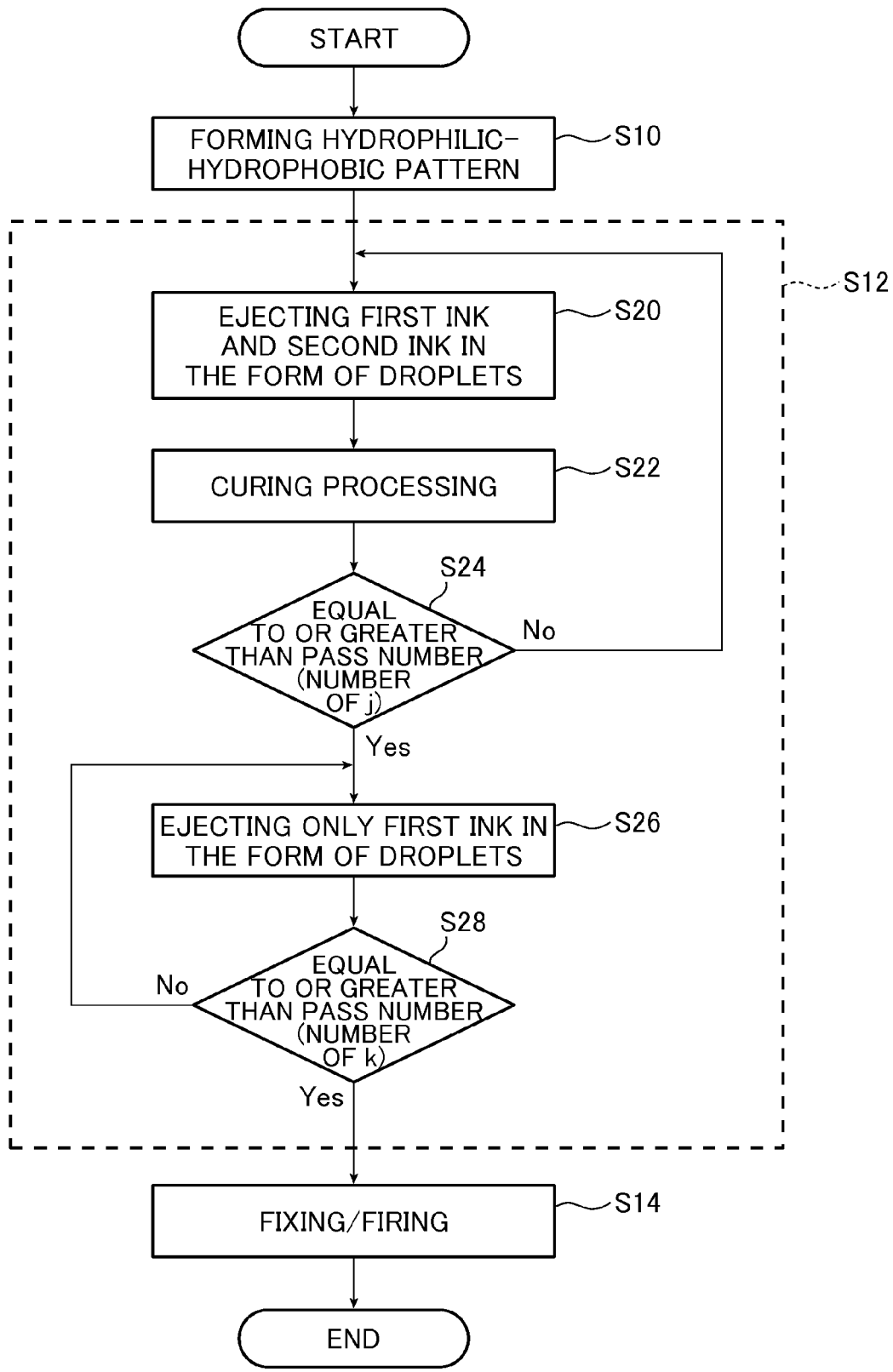
FIG. 8 is a flowchart showing another pattern forming method of an embodiment of the present invention in order of steps.

FIGS. 6A to 6C are schematic cross-sectional views showing the pattern forming method of the embodiment of the present invention in order of steps. FIG. 7 is a flowchart showing the pattern forming method of the embodiment of the present invention in order of steps. FIG. 8 is a flowchart showing a pattern forming step in the pattern forming method.

First, the detection portion 12 detects the alignment marks m and creates the strain information of the substrate Z (positional information on the alignment marks m). In this case, the image processing portion 26 determines whether or not the strain of the substrate Z is within an allowable range. When the strain of the substrate Z is within an allowable range, the image processing portion 26 does not create the corrective data for the exposure data of the pattern to be formed.

In contrast, when the strain of the substrate Z is out of an allowable range, the corrective exposure data is created for the exposure data of the pattern to be formed. Moreover, the corrective data for droplet ejection (corrective droplet ejection pattern data) is also created.

When the strain of the substrate Z is within an allowable range, the exposure data is used for exposure, and when the strain of the substrate Z is out of an allowable range, the corrective exposure data is used for exposure.

As shown in FIG. 6A, for the substrate Z on which the lyophilic-lyophobic conversion film 40 that originally has liquid repellency is formed, within the surface 40a of the lyophilic-lyophobic conversion film 40, the pattern forming region 42 to which the first ink is ejected in the form of droplets is irradiated with UV light by the exposure portion 14 based on the exposure data. As a result, the pattern forming region 42 becomes lyophilic, and the surface 40a of the lyophilic-lyophobic conversion film 40 is patterned to have the pattern forming region 42 and the non-pattern forming region 44 (Step S10).

When the strain of the substrate Z is within an allowable range, the droplet ejection pattern data is used for forming a pattern, and when the strain of the substrate Z is out of an allowable range, the corrective droplet ejection pattern data is used for forming a pattern.

Thereafter, in the pattern forming portion 16, while the driving carriage 50 shown in FIGS. 3A and 3B is being moved in the sub-scanning direction M by a multipass method, the first ink and the second ink are independently ejected in the form of droplets to the pattern forming region 42 and the non-pattern forming region 44 respectively at the same time. This operation is repeated in a predetermined pass number, thereby forming a pattern by simultaneously ejecting the inks in the form of droplets (Step S12).

In this case, after the second ink is ejected in the form of droplets, the second ink droplets 54a is cured by being irradiated with UV light. As a result, as shown in FIG. 6A, first ink droplets 52a and the second ink droplets 54a constituting a first layer 56a are arranged. At this time, because the first ink and the second ink repel each other, the first ink droplets 52a and the second ink droplets 54a are repulsive to each other at the boundary therebetween.

Subsequently, the inks are ejected in the form of droplets such that the droplets are superimposed on the first layer 56a, and the first ink droplets 52a and the second ink droplets 54a are ejected plural times to the same region in a predetermined pass number, such that a second layer 56b, a third layer 56c, and a fourth layer 56d are formed.

Thereafter, the first ink droplets 52a and the second ink droplets 54a are subjected to fixing/firing such that they form a film by being dried or exert a predetermined function such as conductivity (Step S14). As a result, as shown in FIG. 6B, a first film 60 and a second film 62 are formed, and finally, a pattern is formed. In this way, a pattern having a great film thickness is formed by laminating ink droplets. That is, a pattern having a high aspect ratio relative to the line width is formed. For example, it is possible to form a pattern having a thickness of equal to or greater than 20% of the width of the first film 60 (pattern forming region). The thickness of the first film 60 is preferably equal to or greater than 4 μm. The thickness of wiring of the generally used printed wiring board is, for example, 30 μm, 15 μm, 12 μm, and the like. Therefore, the thickness of the first film 60 is preferably about 15 μm and more preferably about 30 μm.

In the present embodiment, the irradiation of a $CO_2$ laser beam does not need to be performed for curing the second ink droplets, and accordingly, a pattern having a high aspect ratio relative to the line width can be easily formed.

Herein, all of Steps S10, S12, and S14 are performed in a state in which transport of the substrate Z is stopped.

In the present embodiment, for example, a conductive ink is used as the first ink, and an insulating ink is used as the second ink. In this way, a conductive pattern and an insulating pattern can be simultaneously formed. For example, in FIG. 6B, the first film 60 can be formed as a conductive film, and the second film 62 can be formed as an insulating film. Moreover, because the conductive pattern and the insulating pattern can be simultaneously formed, productivity is high.

Furthermore, if inks differing from each other in terms of refractive index are used as the first ink and the second ink, an optical device can be formed. In addition, it is possible to form patterns of electronic wiring, printed wiring boards, electrodes for semiconductors, electronic devices, display devices, optical devices, signage, and ornaments, wiring patterns of electronic wiring substrates, and the like. By forming a wiring pattern of an electronic wiring substrate, an electronic wiring substrate is prepared.

In the present embodiment, if the number of layers laminated on each other is reduced, a thin pattern can be formed.

In addition, as shown in FIG. 6C, a third film 64 covering the first film 60 and the second film 62 can be formed. For example, if a UV curable insulating ink is ejected as the second ink in the form of droplets from the second ejection head and cured by UV exposure, the third film 64 is formed. By using the insulating ink as the second ink, the third film 64 can be formed as an insulating film.

For example, the pattern forming step as Step S12 can be a step performed as shown in FIG. 8.

In this case, the ink is also ejected in the form of droplets by the multipass method. First, the first ink and the second ink are independently ejected in the form of droplets to the pattern forming region and the non-pattern forming region at the same time so as to perform droplet ejection of a first pass (Step S20).

Then, the second ink is subjected to UV exposure so as to perform curing processing (Step S22).

Step S20 and Step S22 are repeated until the pass number becomes a predetermined number (number of j) (Step S24). After the pass number becomes a predetermined number (number of j), only the first ink is ejected in the form of droplets to the pattern forming region (Step S26).

Thereafter, Step S26 is repeated until the pass number becomes a predetermined number (number of k) (Step S28). At this time, the second ink droplets 54a have been cured. Accordingly, the first ink droplets 52a are blocked by the cured second ink droplets 54a, and besides, the first ink droplets 52a and the second ink droplets 54a repel each other. Consequentially, it is possible to fill the pattern forming region with the first ink droplets 52a by ejecting much more first ink droplets 52a to the pattern forming region. As a result, unlike in the general ink jet printing (prior art), the thickness of the first film formed of the first ink can be increased relative to the pattern width of the first film. That is, it is possible to form a pattern having a high aspect ratio relative to the width of the pattern forming region.

Subsequently, after the pass number becomes a predetermined number (number of k), the first ink droplets 52a and the second ink droplets 54a are subjected to fixing/firing, such that they form a film by being dried or exert a predetermined function such as conductivity (Step S14). A pattern can also be formed in this way.

Herein, when the lyophilic-lyophobic conversion film 40, which has undergone the lyophilic processing and has been patterned to have a pattern forming region and a non-pattern forming region, is used, Step S10 of patterning is unnecessary.

In the present embodiment, in addition to the aforementioned patterns, the following conductive patterns can also be formed.

Figure 9:
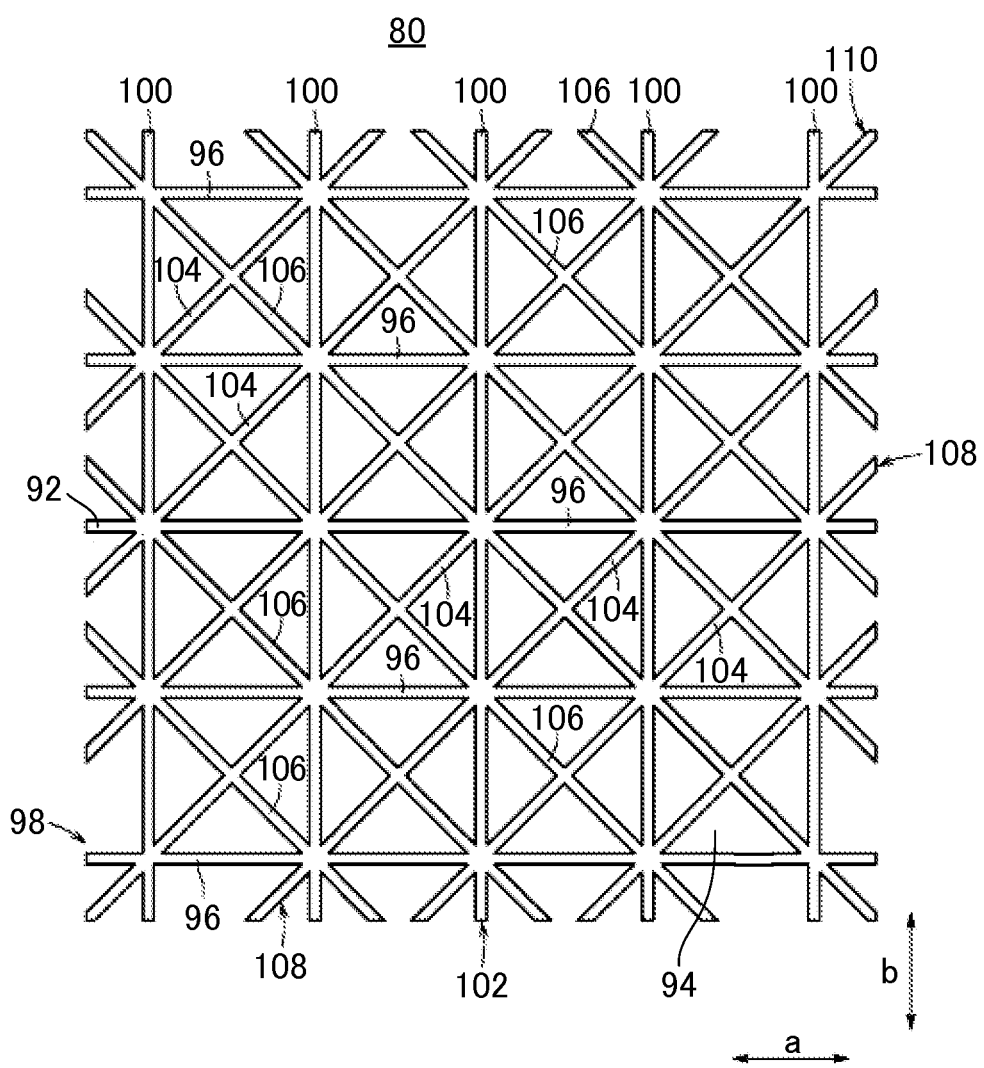
FIG. 9 is a schematic plan view showing a conductive pattern.

A conductive pattern 80 shown in FIG. 9 has a plurality of first straight lines 96 that extend in a horizontal direction (direction of arrow a (a first direction)) in a state of being parallel to each other. A first straight line group 98 is formed of the plurality of first straight lines 96.

In FIG. 9, a symbol 92 indicates a pattern forming region, and a symbol 94 indicates a non-pattern forming region. A conductive film is formed in the pattern forming region 92, and an insulating film is formed in the non-pattern forming region 94.

Each of the first straight lines 96 and each of a plurality of second straight lines 100, which extends in a vertical direction (direction of arrow b (a second direction)) in a state of being parallel to each other, cross each other at an angle of about 90°. A second straight line group 102 is formed of the plurality of second straight lines 100, and square grid shapes are formed of the first straight line group 98 and the second straight line group 102.

As shown in FIG. 9, the conductive pattern 80 also has third straight lines 104, which extend toward the second straight lines 100 from the first straight lines 96 and are in the position of a diagonal line of the square grid shapes, and fourth straight lines 106 which extend toward the second straight lines 100 from the first straight lines 96 so as to be orthogonal to the third straight lines 104. That is, each of the third straight lines 104 and the fourth straight lines 106 forms an angle of about 45° with each of the first straight lines 96 and the second straight lines 100. Accordingly, at crossing points of the grid shapes, the first straight lines 96, the second straight lines 100, the third straight lines 104, and the fourth straight lines 106 cross one another. As a result, from a single crossing point (excluding edge), eight straight lines radially spread. That is, in this case, so-called eight direction grid continue.

The conductive pattern 80 has the plurality of third straight lines 104 and the plurality of fourth straight lines 106, and the third straight line group 108 and the fourth straight line group 110 are constituted with the third straight lines 104 and the fourth straight lines 106, respectively.

Figure 10:
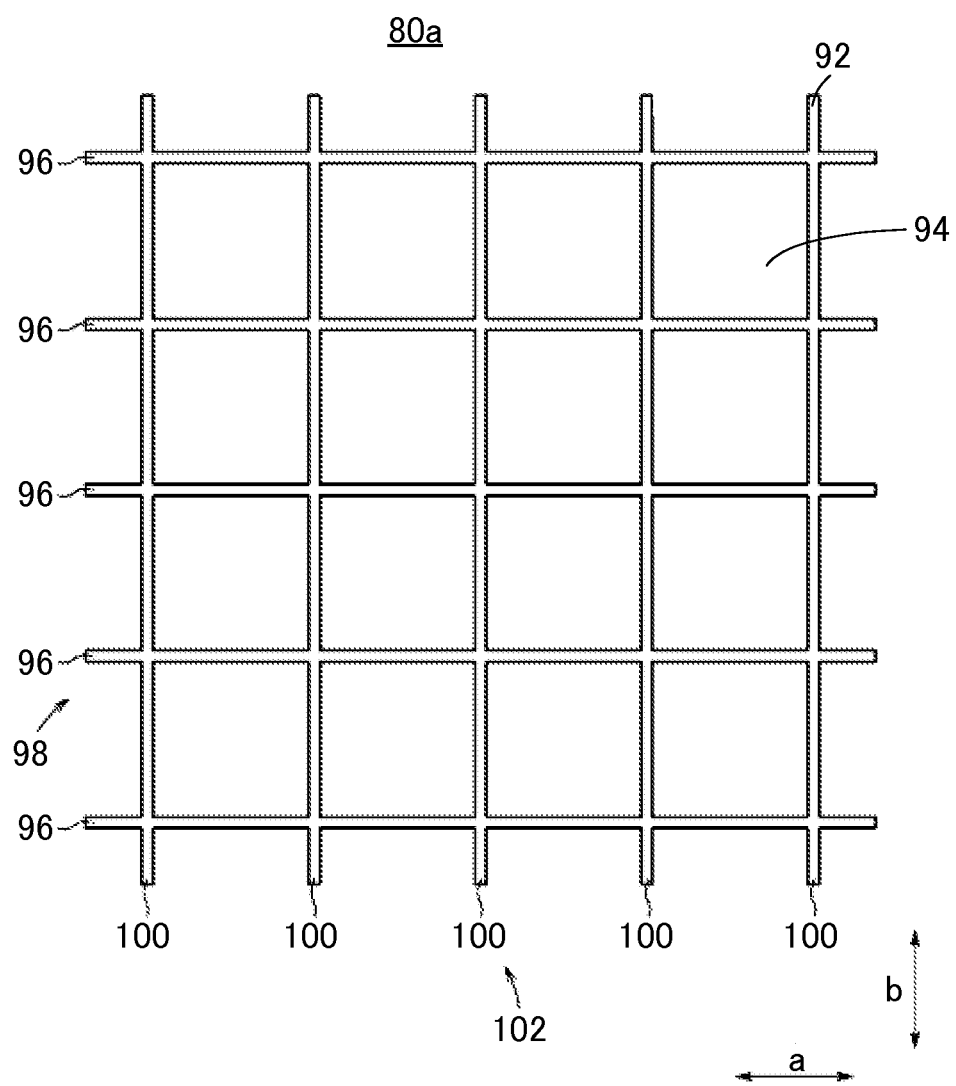
FIG. 10 is a schematic plan view showing a pattern region in which simple square grid shapes are formed.

The conductive pattern 80 shown in FIG. 9 is constituted with the repetitive eight direction grid shapes, but the shape of the conductive pattern is not particularly limited. For example, as a conductive pattern 80a shown in FIG. 10, the conductive pattern may have simple square grid shapes formed of only the first straight line group 98 and the second straight line group 102. In this case, four straight lines radially spread from a single crossing point (excluding edge).

Figure 11:
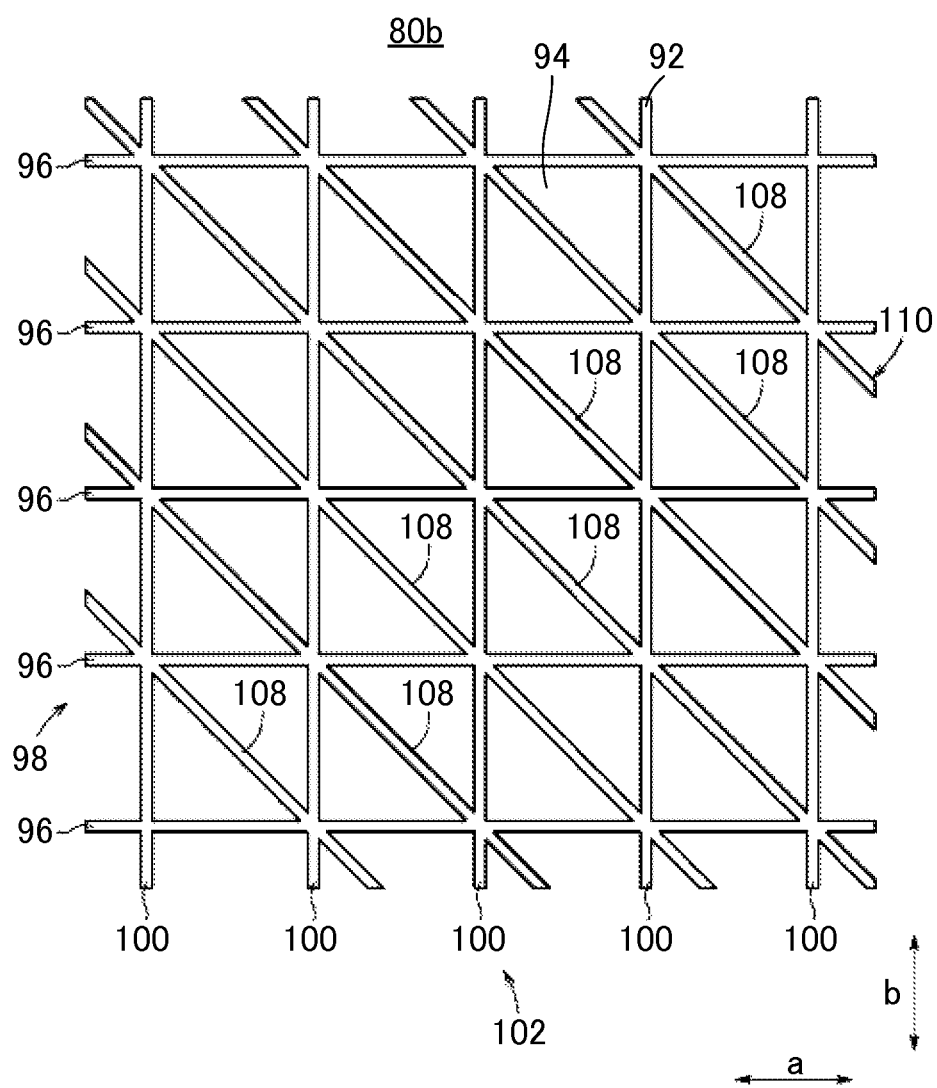
FIG. 11 is a schematic plan view showing a pattern region in which simple square grid shapes and diagonal lines are formed.

Furthermore, as a conductive pattern 80b shown in FIG. 11, the conductive pattern may be in the form a grid in which each of simple square grid shapes has one diagonal line. In this case, the conductive pattern 80b is formed of the first straight line group 98, the second straight line group 102, and the fourth straight line group 110, and six straight lines radially spread from a single crossing point (excluding edge).

Figure 12:
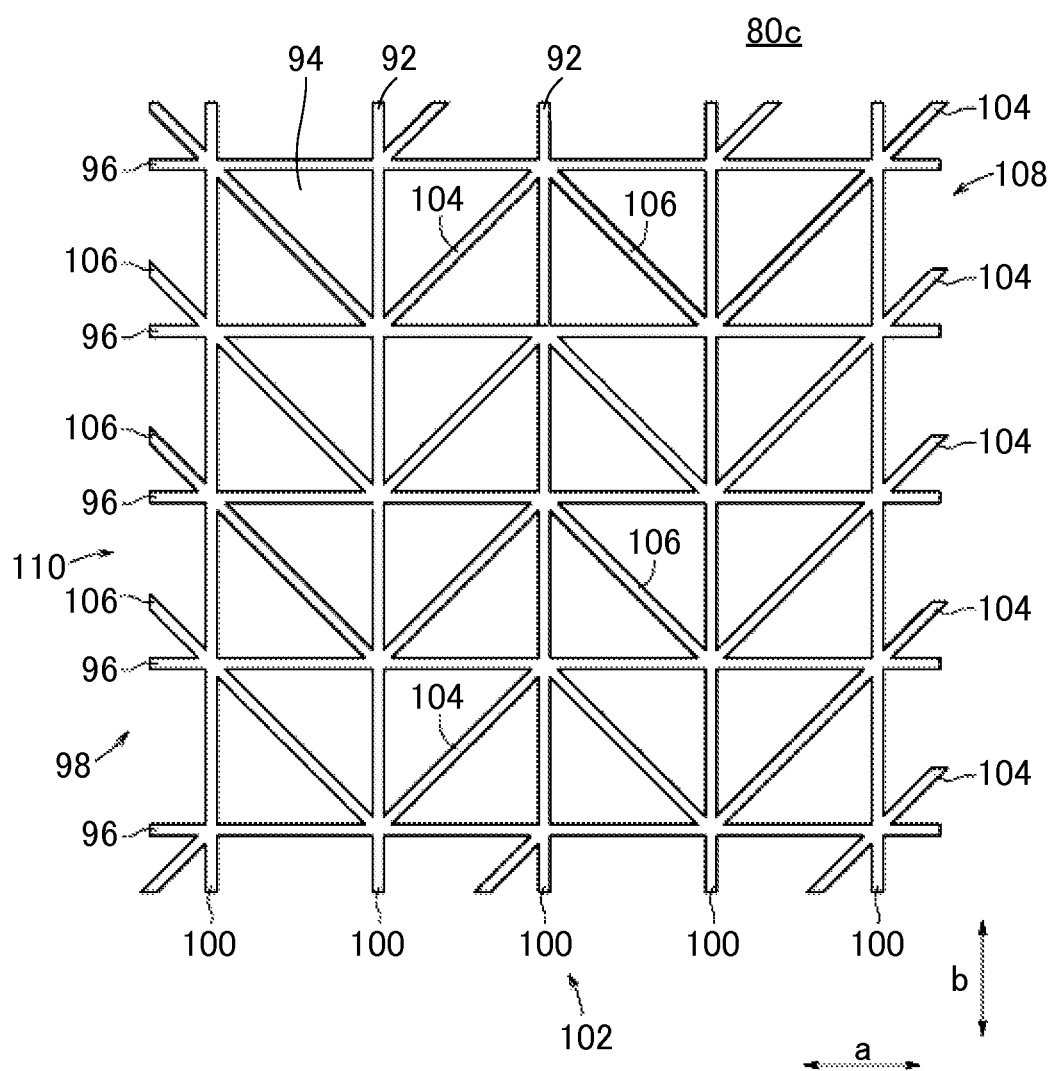
FIG. 12 is a schematic plan view showing a pattern region in which the directions of diagonal lines of grid shapes adjacent to each other are opposite to each other in an A direction and are the same as each other in a B direction.
Figure 13:
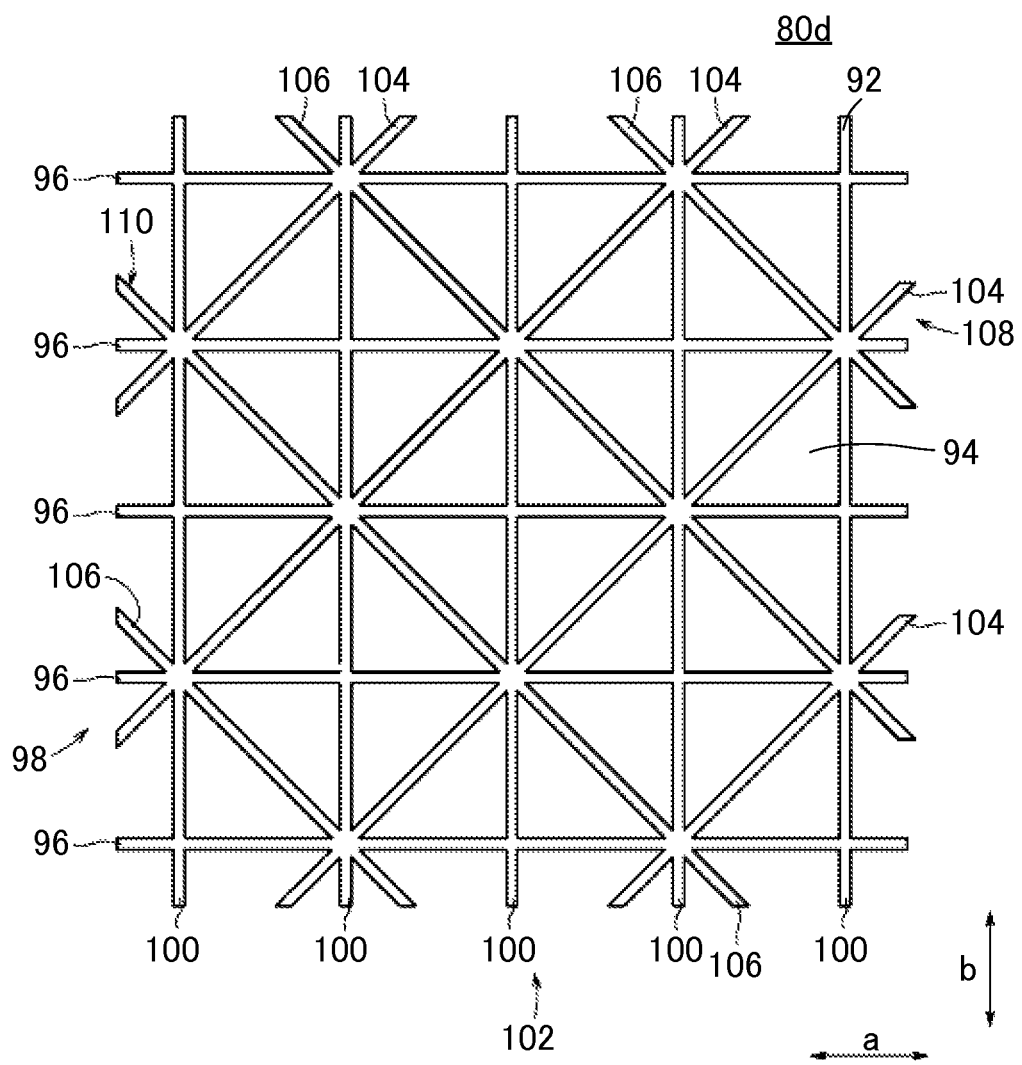
FIG. 13 is a schematic plan view showing a pattern region in which directions of diagonal lines of grid shapes adjacent to each other are opposite to each other in both the A direction and the B direction.

In addition, as a conductive pattern 80c shown in FIG. 12 and a conductive pattern 80d shown in FIG. 13, the conductive pattern may be in the form of a grid in which simple square grid shapes have diagonal lines formed of the fourth straight line group 110 and diagonal lines formed of the third straight line group 108.

Figure 14:
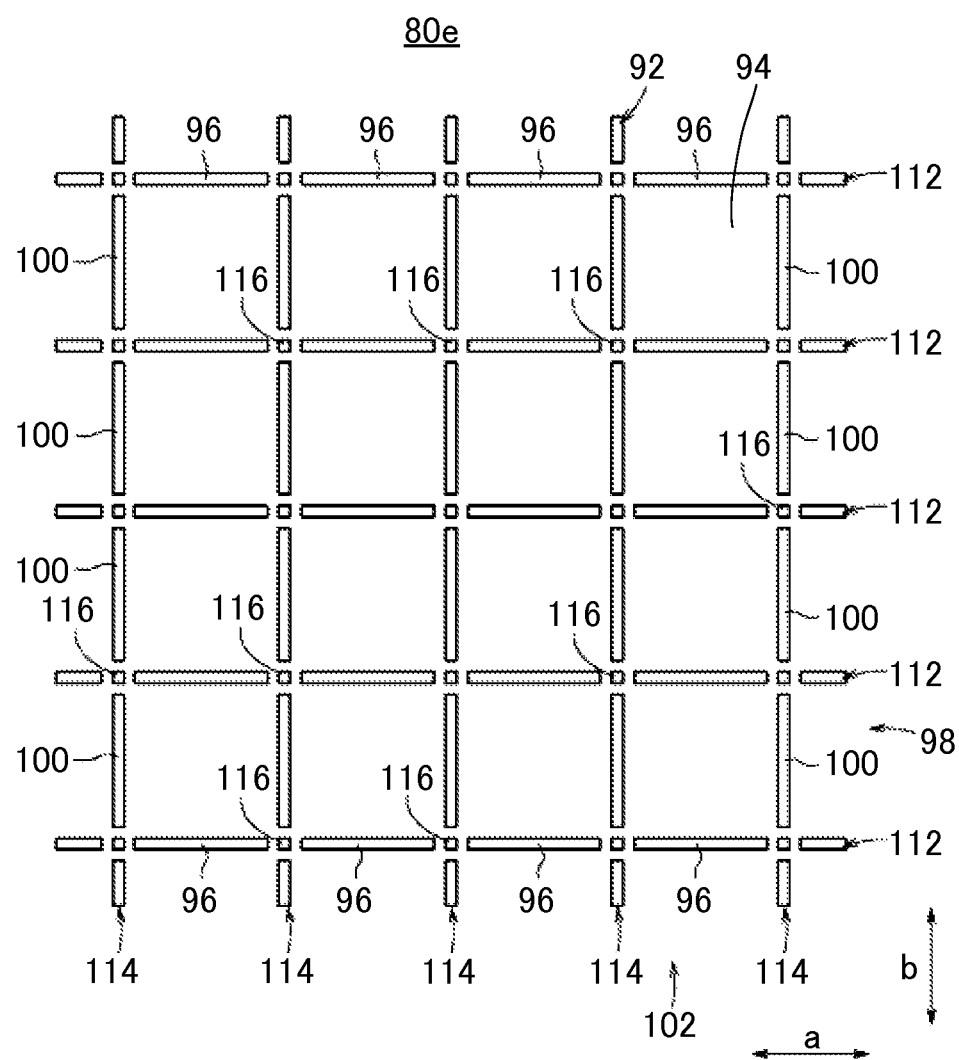
FIG. 14 is a schematic plan view showing a pattern region in which division lines are formed of first straight lines and second straight lines.

Moreover, as a conductive pattern 80e shown in FIG. 14, at least the plurality of first straight lines 96 and the plurality of second straight lines 100 may be arranged on the same axis so as to form apparent division lines. Hereinafter, the apparent division lines formed by arranging the plurality of first straight lines 96 on the same axis and the apparent division lines formed by arranging the plurality of second straight lines 100 on the same axis are described as first division lines 112 and second division lines 114, respectively.

The division site of each of the first division lines 112, that is, a gap between the first straight lines 96 positioned on the same axis, is identical to the division site of each of the second division lines 114, that is, a gap between the second straight lines 100 positioned on the same axis. To summarize, in this case, the conductive pattern has a shape in which the site, at which a crossing point is supposed to be formed between each of the first straight lines 96 and each of the second straight lines 100, is divided. In the present invention, such a shape is also included in the grid shape.

At the division site (site which is supposed to be a crossing point), a pattern forming region 116 in the form of a dot is formed. Accordingly, two first straight lines 96 and the pattern forming region 116 in the form of a dot form an apparent dot-and-dash line, and two second straight lines 100 and the pattern forming region 116 in the form of a dot form an apparent dot-and-dash line.

Figure 15:
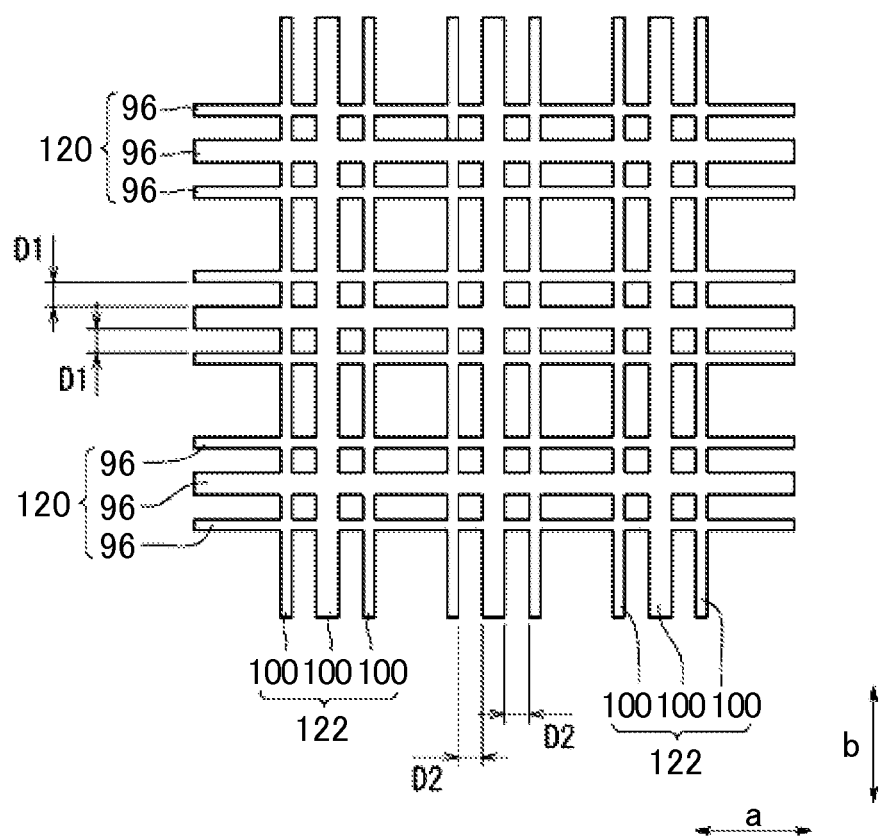
FIG. 15 is a schematic plan view showing a pattern region in the form of an aggregation of the first straight lines and the second straight lines.

Furthermore, as a conductive pattern 80f shown in FIG. 15, the first straight lines 96 or the second straight lines 100 may be arranged close together so as to form an aggregation. In the example shown in FIG. 15, three first straight lines 96 form one first aggregation 120; among the three first straight lines 96 constituting the first aggregation 120, the dimension of the central line in the width direction is set to be greater than that of two other lines; three second straight lines 100 form one second aggregation 122; and among the three second straight lines 100 constituting the second aggregation 122, the dimension of the central line in the width direction is set to be greater than that of two other lines. Even in this case, the grid shape is formed of the first aggregation 120 and the second aggregation 122.

In the first aggregation 120, a clearance D1 between the central line and two other first straight lines 96 is set to be equal to or less than the diameter of a dot obtained by ejecting the first ink in the form of droplets. Likewise, in the second aggregation 122, a clearance D2 between the central line and two other second straight lines 100 is set to be equal to or less than the diameter of a dot obtained by ejecting the first ink in the form of droplets.

In this case, for example, if ink droplets are ejected to only one out of two lines adjacent to the central line in each of the first aggregation 120 and the second aggregation 122, a finest conductive pattern can be formed. Moreover, if ink droplets are ejected only to the central line in each of the first aggregation 120 and the second aggregation 122, it is possible to obtain a conductive pattern in which the dimension in the width direction is slightly great.

The ink may be ejected in the form of droplets to the space between the central line and one out of two lines adjacent to the central line. The space between the central line and the line adjacent thereto is the non-pattern forming region. However, as described above, the clearances D1 and D2 are equal to or less than the diameter of a dot obtained by ejecting the first ink in the form of droplets, and accordingly, the first ink can be diffused such that it straddles both the central line and the line adjacent thereto.

Needless to say, the ink can also be ejected in the form of droplets to a space between the central line and the other line out of two lines adjacent to the central line. In this case, a conductive pattern having widened in the entire width direction of the first aggregation 120 or the second aggregation 122 is obtained.

Next, the materials used in the lyophilic-lyophobic conversion film 40 will be described.

For example, as the lyophilic-lyophobic conversion film 40, a photocatalyst-containing material can be used. In this case, the photocatalyst-containing material contains fluorine. When the first film (photocatalyst-containing layer) formed of the photocatalyst-containing material is irradiated with energy, by the action of the photocatalyst, the content of fluorine on the surface of the photocatalyst-containing material is reduced compared to the content thereof before energy irradiation, and the volume of the region having undergone energy irradiation is reduced. The first film may be a photocatalyst-containing layer containing a decomposable material which is decomposed by the action of the photocatalyst by energy radiation, thereby changing wettability on the photocatalyst-containing layer and reducing the volume of the region irradiated with energy.

The photocatalyst, the binder, and other components of the photocatalyst-containing material will be described below.

First, the photocatalyst will be described. Examples of the photocatalyst used in the present embodiment include compounds known as optical semiconductors such as titanium dioxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$). One kind selected from among these can be used singly, or two or more kinds thereof can be used in the form of a mixture.

Particularly, titanium dioxide is preferably used since this compound has high band gap energy, is chemically stable and nontoxic, and is easily obtained. The titanium dioxide includes an anatase type and a rutile type, and any of these can be used in the present embodiment. However, it is preferable to use the anatase-type titanium dioxide. An excitation wavelength of the anatase-type titanium dioxide is equal to or less than 380 nm.

Examples of the anatase-type titanium dioxide include anatase-type titania sol deflocculated by hydrochloric acid (STS-02 (mean particle size of 7 nm) and ST-K01 manufactured by ISHIHARA SANGYO KAISHA, LTD.), anatase-type titania sol deflocculated by nitric acid (TA-15 (mean particle size of 12 nm) manufactured by NISSAN CHEMICAL INDUSTRIES, LTD), and the like.

The smaller the particle size of the photocatalyst, the better, since a photocatalytic reaction more effectively occurs. The mean particle size of the photocatalyst is preferably equal to or less than 50 nm. It is particularly preferable to use a photocatalyst having a particle size of equal to or less than 20 nm.

The content of the photocatalyst in the photocatalyst-containing layer can be set within a range of 5% by weight to 60% by weight, and preferably within a range of 20% by weight to 40% by weight. Moreover, the thickness of the photocatalyst-containing layer is preferably within a range of 0.05 μm to 10 μm.

Next, the binder will be described. The embodiments of changing wettability on the photocatalyst-containing layer can be classified into three embodiments including a first embodiment in which the photocatalyst is caused to act on the binder, a second embodiment in which a decomposable substance, which is decomposed by the action of the photocatalyst by energy irradiation and thus can change wettability on the photocatalyst-containing layer, is contained in the photocatalyst-containing layer, and a third embodiment which is performed by the first and second embodiments in combination. The binder used in the first embodiment and the third embodiment needs to have a function of changing wettability on the photocatalyst-containing layer by the action of the photocatalyst, and the binder used in the second embodiment does not need to have such a function.

The binder, which is used in the second embodiment and does not need to have a function of changing wettability on the photocatalyst-containing layer by the action of the photocatalyst, is not particularly limited as long as the binder has strong bond energy that prevents the main skeleton thereof from being decomposed by photoexcitation of the photocatalyst. Specifically, examples of the binder include polysiloxanes which do not have an organic substituent or having a small amount of organic substituent. The polysiloxanes can be obtained by hydrolysis and polycondensation of tetramethoxysilane, tetraethoxysilane, and the like.

When such a binder is used, as an additive, a decomposable substance, which is decomposed by the action of the photocatalyst by energy irradiation and thus can change wettability on the photocatalyst-containing layer, is essentially contained in the photocatalyst-containing layer. The decomposable substance will be described later.

Next, the binder, which is used in the first and third embodiments and needs to have a function of changing wettability on the photocatalyst-containing layer by the action of the photocatalyst, will be described. As such a binder, a binder is preferable which has strong bond energy that prevents the main skeleton thereof from being decomposed by photoexcitation of the aforementioned photocatalyst and has an organic substituent that is decomposed by the action of the photocatalyst. Examples of such a binder include organopolysiloxane which exerts great strength by hydrolysis and polycondensation of chlorosilane or alkoxysilane by means of a sol-gel reaction or the like, organopolysiloxane crosslinked with reactive silicone having excellent water repellency and oil repellency, and the like.

The aforementioned organopolysiloxane, which exerts great strength by hydrolysis and polycondensation of chlorosilane or alkoxysilane by means of a sol-gel reaction or the like, is preferably organopolysiloxane in the form of a hydrolyzed condensate or a cohydrolyzed condensate of one, two, or more kinds of silicon compound represented by Formula $Y_nSiX_{(4-n)}$ (herein, Y represents an alkyl group, a fluoroalkyl group, a vinyl group, an amino group, a phenyl group, or an epoxy group, X represents an alkoxy group, an acetyl group, or halogen, and n is an integer of 0 to 3). Herein, the number of carbon atoms contained in the group represented by Y is preferably within a range of 1 to 20, and the alkoxy group represented by X is preferably a methoxy group, an ethoxy group, a propoxy group, or a butoxy group.

As the binder, polysiloxane containing a fluoroalkyl group can be particularly preferably used. Specific examples thereof include a hydrolyzed condensate and a cohydrolyzed condensate of one, two, or more kinds of the following fluoroalkylsilane, and it is possible to use a compound which is generally known as a fluorine-based silane coupling agent.

$CF_3(CF_2)_3CH_2CH_2Si(OCH_3)_3$;
$CF_3(CF_2)_5CH_2CH_2Si(OCH_3)_3$;
$CF_3(CF_2)_7CH_2CH_2Si(OCH_3)_3$;
$CF_3(CF_2)_9CH_2CH_2Si(OCH_3)_3$;
$(CF_3)_2CF(CF_2)_4CH_2CH_2Si(OCH_3)_3$;
$(CF_3)_2CF(CF_2)_6CH_2CH_2Si(OCH_3)_3$;
$(CF_3)_2CF(CF_2)_8CH_2CH_2Si(OCH_3)_3$;
$CF_3(C_6H_4)C_2H_4Si(OCH_3)_3$;
$CF_3(CF_2)_3(C_6H_4)C_2H_4Si(OCH_3)_3$;
$CF_3(CF_2)_5(C_6H_4)C_2H_4Si(OCH_3)_3$;
$CF_3(CF_2)_7(C_6H_4)C_2H_4Si(OCH_3)_3$;
$CF_3(CF_2)_3CH_2CH_2SiCH_3(OCH_3)_2$;
$CF_3(CF_2)_5CH_2CH_2SiCH_3(OCH_3)_2$;
$CF_3(CF_2)_7CH_2CH_2SiCH_3(OCH_3)_2$;
$CF_3(CF_2)_9CH_2CH_2SiCH_3(OCH_3)_2$;
$(CF_3)_2CF(CF_2)_4CH_2CH_2SiCH_3(OCH_3)_2$;
$(CF_3)_2CF(CF_2)_6CH_2CH_2SiCH_3(OCH_3)_2$;
$(CF_3)_2CF(CF_2)_8CH_2CH_2SiCH_3(OCH_3)_2$;
$CF_3(C_6H_4)C_2H_4SiCH_3(OCH_3)_2$;
$CF_3(CF_2)_3(C_6H_4)C_2H_4SiCH_3(OCH_3)_2$;
$CF_3(CF_2)_5(C_6H_4)C_2H_4SiCH_3(OCH_3)_2$;
$CF_3(CF_2)_7(C_6H_4)C_2H_4SiCH_3(OCH_3)_2$;
$CF_3(CF_2)_3CH_2CH_2Si(OCH_2CH_3)_3$;
$CF_3(CF_2)_5CH_2CH_2Si(OCH_2CH_3)_3$;
$CF_3(CF_2)_7CH_2CH_2Si(OCH_2CH_3)_3$;
$CF_3(CF_2)_9CH_2CH_2Si(OCH_2CH_3)_3$;
$CF_3(CF_2)_7SO_2N(C_2H_5)C_2H_4CH_2Si(OCH_3)_3$

If the above polysiloxane containing a fluoroalkyl group is used as the binder, liquid repellency of the portion not subjected to energy irradiation in the photocatalyst-containing layer is greatly improved, and a function of hindering adherence of metal paste is exerted.

Examples of the aforementioned reactive silicone having excellent water repellency and oil repellency include a compound having a skeleton represented by the following Formula.

[Chem. 2]

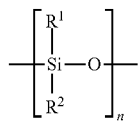

In the formula, n is an integer of equal to or greater than 2, and each of $R^1$ and $R^2$ is a substituted or unsubstituted alkyl, alkenyl, aryl, or cyanoalkyl group having 1 to 10 carbon atoms. A ratio of vinyl, phenyl, or halogenated phenyl in the entire skeleton is equal to or less than 40% in terms of molar ratio. Each of $R^1$ and $R^2$ is preferably a methyl group since the surface energy is minimized, and the ratio of the methyl group is preferably equal to or greater than 60% in terms of molar ratio. Moreover, on the terminal of a chain or on a side chain, at least one or more reactive groups such as hydroxyl groups are contained in the molecular chain thereof.

Furthermore, in addition to the aforementioned organopolysiloxane, a stable organosilicon compound such as dimethylpolysiloxane which does not cause a crosslinking reaction may be mixed with the binder.

Next, the decomposable substance will be described.

In the second and third embodiments, the decomposable substance, which is decomposed by the action of the photocatalyst by energy irradiation and thus can change wettability on the photocatalyst-containing layer, needs to be added to the photocatalyst-containing layer. That is, when the binder does not have a function of changing wettability on the photocatalyst-containing layer, and when such a function is unsatisfactory, the aforementioned decomposable substance is added such that it brings about change of wettability on the photocatalyst-containing layer or assist such a change.

Examples of the decomposable substance include surfactants which are decomposed by the action of the photocatalyst and function to change wettability on the photocatalyst-containing layer by being decomposed as above. Specific examples thereof include hydrocarbon-based nonionic surfactants such as NIKKOL BL series, BC series, BO series, and BB series manufactured by Nikko Chemicals Co., Ltd., and fluorine- or silicone-based nonionic surfactants such as ZONYL FSN, FSO manufactured by DuPont, Surflon S-141, 145 manufactured by ASAHI GLASS CO., LTD., Megaface F-141, 144 manufactured by DIC Corporation, Ftergent F-200, F251 manufactured by Neos Corporation, Unidyne DS-401, 402 manufactured by DAIKIN INDUSTRIES, ltd., and Fluorad FC-170, 176 manufactured by 3M. Moreover, cationic surfactants, anionic surfactants, and amphoteric surfactants can also be used.

In addition to the surfactants, examples of the decomposable substance also include oligomers, polymers, and the like such as polyvinyl alcohol, unsaturated polyester, an acryl resin, polyethylene, diallyl phthalate, an ethylene-propylene-diene monomer, an epoxy resin, a phenol resin, polyurethane, a melamine resin, polycarbonate, polyvinyl chloride, polyamide, polyimide, styrene butadiene rubber, chloroprene rubber, polypropylene, polybutyrene, polystyrene, polyvinyl acetate, nylon, polyester, polybutadiene, polybenzimidazole, polyacrylonitrile, epichlorohydrin, polysulfide, and polyisoprene.

Furthermore, the photocatalyst-containing layer preferably contains fluorine, and the photocatalyst-containing layer is preferably formed such that the content of fluorine on the surface of the photocatalyst-containing layer is reduced by the action of the photocatalyst when the photocatalyst-containing layer is irradiated with energy, compared to the content of fluorine before energy irradiation.

Regarding the content of fluorine in the photocatalyst-containing layer containing fluorine, when the fluorine content in a portion not irradiated with energy is regarded as being 100, the fluorine content in the lyophilic region with a small fluorine content that is formed by energy irradiation is equal to or less than 10, preferably equal to or less than 5, and particularly preferably equal to or less than 1.

As the lyophilic-lyophobic conversion film 40, a self-assembled film formed of an organic molecular film or the like can also be used. The organic molecular film for treating the substrate surface has a functional group that can bind to the substrate at one end and a functional group that modifies the properties of the substrate surface into liquid repellency or the like (a functional group that controls the surface energy) at the other end, and has a linear or partially branched carbon chain connecting the functional groups to each other. By binding to the substrate, the organic molecular film forms a molecular film such as a monomolecular film by means of self assembly.

The self-assembled film is a film which is formed of binding functional groups that can react with atoms constituting an underlayer such as a substrate and linear molecules other than the binding functional groups. The self-assembled film is formed by aligning compounds having an extremely high degree of alignment properties due to the interaction between the linear molecules. Being formed by aligning monomolecules, the self-assembled film can be made into an extremely thin film and becomes a uniform film at a molecular level. That is, because the same molecules are positioned on the surface of the film, uniform and excellent liquid repellency or the like can be imparted to the surface of the film.

For example, when fluoroalkylsilane is used as the compound having a high degree of alignment properties, the compounds are aligned such that fluoroalkyl groups are positioned on the film surface, and in this way, a self-assembled film is formed. Consequentially, uniform liquid repellency is imparted to the film surface.

Examples of the compound forming a self-assembled film include fluoroalkylsilane (hereinafter, described as "FAS") such as heptadecafluoro-1,1,2,2 tetrahydrodecyl triethoxysilane, heptadecafluoro-1,1,2,2 tetrahydrodecyl trimethoxysilane, heptadecafluoro-1,1,2,2 tetrahydrodecyl trichlorosilane, tridecafluoro-1,1,2,2 tetrahydrooctyl triethoxysilane, tridecafluoro-1,1,2,2 tetrahydrooctyl trimethoxysilane, tridecafluoro-1,1,2,2 tetrahydrooctyl trichlorosilane, and trifluoropropyl trimethoxysilane. It is preferable to use one kind of the compound singly. However, two or more kinds of the compound may be used in combination without limitation, as long as the intended purpose of the present invention is not impaired. Furthermore, in the present invention, it is preferable to use the FAS as the compound forming the self-assembled film, since adhesiveness between the film and the substrate becomes better, and excellent liquid repellency is imparted to the film surface.

Generally, FAS is represented by a structural formula $R_nSiX_{(4-n)}$. Herein, n represents an integer of 1 to 3, and X is a hydrolyzable group such as a methoxy group, an ethoxy group, or a halogen atom. R is a fluoroalkyl group and has a structure of $(CF_3)(CF_2)x(CH_2)y$ (herein, x represents an integer of 0 to 10, and y represents an integer of 0 to 4). When a plurality of Rs or Xs binds to Si, Rs or Xs may be the same as or different from each other. The hydrolyzable group represented by X forms silanol by hydrolysis and binds to the substrate through a siloxane bond by reacting with a hydroxyl group of the underlayer as the substrate. Meanwhile, because R has a fluoro group such as $(CF_3)$ on the surface thereof, R modifies the surface of the underlayer such as the substrate into a non-wettable surface (a surface having low surface energy).

If the aforementioned raw material compound and a substrate are put into the same airtight container and left for about 2 days to 3 days at room temperature, the self-assembled film formed of an organic molecular film or the like is formed on the substrate. Moreover, if the entire airtight container is kept at 100° C., it takes about 3 hours to form self-assembled film on the substrate. Although the aforementioned process is a formation method performed in a gaseous phase, the self-assembled film can also be formed in a liquid phase. For example, if the substrate is dipped in a solution containing the raw material compound and then washed and dried, the self-assembled film can be formed on the substrate.

In addition, before forming the self-assembled film, it is preferable to perform preprocessing by irradiating the substrate surface with ultraviolet light or by washing the substrate with a solvent.

The lyophilic-lyophobic conversion film 40 can be constituted with a material of which critical surface tension is greatly changed when energy is supplied thereto. Examples of such a material include a polymer material containing a hydrophobic group on a side chain, and examples of the polymer material include polymer materials in which the side chain having the hydrophobic group has bound to the main chain having a skeleton of polyimide, (meth)acrylate, or the like directly or through a linking group.

Examples of the hydrophobic group include groups having —$CF_2CH_3$, —$CF_2CF_2$, —$CF(CF_3)_2$, —$C(CF_3)_3$, —$CF_2H$, —$CFH_2$, or the like as a terminal structure. In order to make it easy for molecular chains to be aligned, groups having a long carbon chain are preferable, and groups having 4 or more carbon atoms are more preferable. Moreover, a polyfluoroalkyl group (hereinafter, described as an "Rf group") in which two or more hydrogen atoms of an alkyl group have been substituted with fluorine atoms is preferable. Particularly, an Rf group having 4 to 20 carbon atoms is preferable, and an Rf group having 6 to 12 carbon atoms is more preferable. The Rf group may have a linear structure or a branched structure, but the Rf group having a linear structure is preferable. Furthermore, the hydrophobic group is preferably a perfluoroalkyl group in which substantially all hydrogen atoms of an alkyl group have been substituted with fluorine atoms. The perfluoroalkyl group is preferably a group represented by $C_nF_{2n+1}$— (herein, n is an integer of 4 to 16), and particularly, a group in which n is an integer of 6 to 12 is preferable. The perfluoroalkyl group may have a linear structure or a branched structure, but the perfluoroalkyl group having a linear structure is preferable.

The aforementioned materials are well known because they are specifically described in JP 2796575 B and the like. When being brought into contact with a liquid or a solid in a heated state, the materials become lyophilic, and when being heated in the air, the materials become lyophobic. That is, the critical surface tension thereof can be changed by supplying heat energy thereto (and the type of contact medium selected).

Examples of the hydrophobic group also include groups having a terminal structure such as —$CH_2CH_3$, —$CH(CH_3)_2$, or —$C(CH_3)_3$ not containing a fluorine atom. Even in this case, in order to make it easy for the molecular chains to be aligned, groups having a long carbon chain are preferable, and groups having 4 or more carbon atoms are more preferable. The hydrophobic group may have a linear structure or a branched structure, but the hydrophobic group having a linear structure is preferable. The aforementioned alkyl group may contain a halogen atom, a cyano group, a phenyl group, a hydroxyl group, a carboxyl group, or a phenyl group substituted with a linear, branched, or cyclic alkyl group or alkoxy group having 1 to 12 carbon atoms. It is considered that the more the binding sites of R, the lower the surface energy (the smaller the critical surface tension), and the material becomes lyophobic. Presumably, by ultraviolet irradiation or the like, a portion of bonds is cut, or the alignment state is changed, and as a result, the critical surface tension increases, and the material becomes lyophilic.

In addition to the aforementioned groups, examples of the hydrophobic group also include an organosilicon group represented by —$SiR_3$. Herein, R is an organic group having a siloxane bond.

Among the aforementioned hydrophobic groups, particularly in the hydrophobic group having a methylene group, C—H bond energy (338 kJ/mol) is smaller than a C—F bond (552 kJ/mol) of a fluorine-based material and a Si—C bond (451 kJ/mol) of a silicone-based material. Therefore, by supplying energy by means of ultraviolet irradiation or the like, a portion of the bond can be easily cut.

Examples of the polymer material having a hydrophobic group on a side chain include polymer materials containing polyimide. Polyimide has excellent electrical insulating properties, chemical resistance, and heat resistance. Accordingly, when polyimide is used for forming an electrode layer or the like on an insulating wettability variable layer, the electrode layer does not swell and crack even if the temperature is changed due to a solvent and firing. Consequentially, in a laminated structure, an insulating wettability variable layer, which has excellent electrical insulating properties, is not damaged in the manufacturing process, and exhibits high reliability, can be formed. Furthermore, when the insulating wettability variable layer is constituted with two or more kinds of material, considering heat resistance, solvent resistance, and affinity, it is desirable for materials other than the polymer material having a hydrophobic group on a side chain to be formed of polyimide.

Generally, because a dielectric constant of a polyimide material is smaller than a dielectric constant of $SiO_2$ which is generally used as an insulating material, the polyimide material is suitable as an interlayer insulating film. For example, the hydrophobic group of the polyimide having the hydrophobic group on a side chain is represented by any of the following chemical formulae.

[Chem. 3]

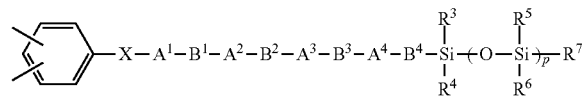

Herein, X is —$CH_2$— or —$CH_2CH_2$—; $A^1$ is 1,4-cyclohexylene, 1,4-phenylene, or 1,4-phenylene substituted with 1 to 4 fluorine atoms; each of $A^2$, $A^3$, and $A^4$ is independently a single bond, 1,4-cyclohexylene, 1,4-phenylene, or 1,4-phenylene substituted with 1 to 4 fluorine atoms; each of $B^1$, $B^2$, and $B^3$ is independently a single bond or —$CH_2CH_2$—; $B^4$ is alkylene having 1 to 10 carbon atoms; each of $R^3$, $R^4$, $R^5$, $R^6$, and $R^7$ is independently alkyl having 1 to 10 carbon atoms; and p is an integer of equal to or greater than 1.

[Chem. 4]

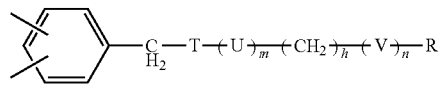

In the above chemical formula, each of T, U, and V is independently a benzene ring or a cyclohexane ring; any H on these rings may be substituted with alkyl having 1 to 3 carbon atoms, fluorine-substituted alkyl having 1 to 3 carbon atoms, F, Cl, or CN; each of m and n is independently an integer of 0 to 2; h is an integer of 0 to 5; R is H, F, Cl, CN, or a monovalent organic group; when m is 2, two Us may be the same as or different from each other; and when n is 2, two Vs may be the same as or different from each other.

[Chem. 5]

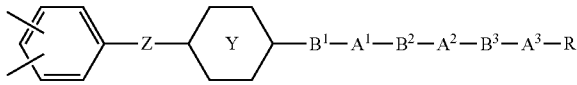

In the above chemical formula, a linking group Z is $CH_2$, CFH, $CF_2$, $CH_2CH_2$, or $CF_2O$; a ring Y is 1,4-cyclohexylene or 1,4-phenylene in which 1 to 4 Hs may be substituted with F or $CH_3$; each of $A^1$ to $A^3$ is independently a single bond, 1,4-cyclohexylene, or 1,4-phenylene in which 1 to 4 Hs may be substituted with F or $CH_3$; each of $B^1$ to $B^3$ is independently a single bond, alkylene having 1 to 4 carbon atoms, an oxygen atom, oxyalkylene having 1 to 3 carbon atoms, or alkyleneoxy having 1 to 3 carbon atoms; R is H, alkyl having 1 to 10 carbon atoms in which any $CH_3$ may be substituted with $CF_2$ or alkoxy or alkoxyalkyl having 1 to 9 carbon atoms in which one $CH_3$ may be substituted with $CF_2$; and an amino group may binds to a benzene ring in any position. Here, when Z is $CH_2$, $B^1$ to $B^3$ do not simultaneously represent alkylene having 1 to 4 carbon atoms; when Z is $CH_2CH_2$, and the ring Y is 1,4-phenylene, $A^1$ and $A^2$ do not simultaneously represent a single bond; and when Z is $CF_2O$, the ring Y does not represent 1,4-cyclohexylene.

[Chem. 6]

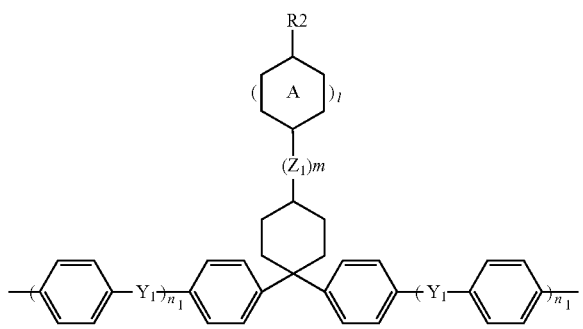

In the above chemical formula, R2 is a hydrogen atom or an alkyl group having 1 to 12 carbon atoms; $Z_1$ is a $CH_3$ group; m is 0 to 2; a ring A is a benzene ring or a cyclohexane ring; l is 0 or 1; each of $Y_1$s is independently an oxygen atom or a $CH_2$ group; and each of $n_1$s is independently 0 or 1.

[Chem. 7]

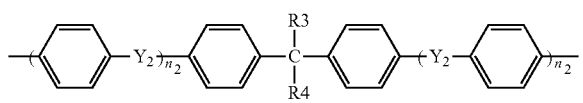

In the above chemical formula, each of $Y_2$s is independently an oxygen atom or a $CH_2$ group; each of R3 and R4 is independently a hydrogen atom, an alkyl group having 1 to 12 carbon atoms, or a perfluoroalkyl group; at least one of R3 and R4 is an alkyl group having 3 or more carbon atoms or a perfluoroalkyl group; and each of $n_2$s is independently 0 or 1.

These materials are specifically described in JP 2002-162630 A, JP 2003-96034 A, JP 2003-267982 A, and the like. Furthermore, for tetracarboxylic dianhydride constituting the main chain skeleton of these hydrophobic groups, various materials such as aliphatic materials, alicyclic materials, and aromatic materials can be used. Specifically, the tetracarboxylic dianhydride includes pyromellitic dianhydride, cyclobutane tetracarboxylic dianhydride, butane tetracarboxylic dianhydride, and the like. In addition, the materials specifically described in JP 11-193345 A, JP 11-193346 A, JP 11-193347 A, and the like can also be used.

The polyimide containing the hydrophobic group represented by the above chemical formula may be used singly or used by being mixed with other materials. However, when the polyimide is used by being mixed with other materials, considering heat resistance, solvent resistance, and affinity, it is desirable to use polyimide as the material mixed with the polyimide. Moreover, it is possible to use polyimide containing a hydrophobic group that is not represented by the above chemical formula.

The lyophilic-lyophobic conversion film 40 may contain a photopolymerization initiator, and a monomer and/or oligomer of an acrylic acid.

The lyophilic-lyophobic conversion film 40 may be a blend material composed of polyimide, which has only a main chain and does not have a side chain controlling wettability, and polyimide which has a main chain and a side chain that controls wettability and brings low surface energy before energy is supplied to the film. Alternatively, the lyophilic-lyophobic conversion film 40 may be a blend material composed of polyamic acid as a precursor of polyimide, which has only a main chain and does not have aside chain controlling wettability, and polyamic acid as a precursor of polyimide which has a main chain and a side chain that controls wettability and brings low surface energy before energy is supplied to the film. If the lyophilic-lyophobic conversion film 40 is a blend material composed of a material, which has only a main chain and does not have a side chain that controls wettability, and a material which has a main chain and a side chain that controls wettability and brings low surface energy before energy is supplied to the film, even though the blend material is an epoxy resin, a fluororesin, an acryl resin, or a resin such as polyvinyl phenol or polyvinyl butyral, minute depressions (concavities and convexities) can be formed by supplying energy such as ultraviolet rays.

In this case, for the lyophilic-lyophobic conversion film 40, as an organic insulating material, polyimide, polyamide imide, an epoxy resin, silsesquioxane, polyvinyl phenol, polycarbonate, a fluorine-based resin, polyparaxylene, polyvinyl butyral, or the like is used. Polyvinyl phenol and polyvinyl alcohol may be used by being crosslinked by using an appropriate crosslinking agent. As an inorganic material, $TiO_2$, $SiO_2$, or the like can be used.

Moreover, as the lyophilic-lyophobic conversion film 40, a self-assembled monomolecular film or the like formed of an organic molecular film can be used. The organic molecular film has a functional group that can bind to the substrate at one end and a functional group that modifies the properties of the substrate surface into liquid repellency or the like (a functional group that controls the surface energy) at the other end, and has a linear or partially branched carbon chain connecting the functional groups to each other. By binding to the substrate, the organic molecular film forms a molecular film such as a monomolecular film by means of self assembly. The self-assembled film is composed of binding functional groups that can react with atoms constituting an underlayer such as a substrate and linear molecules other than the binding functional groups, and it is a film that is formed by aligning compounds having an extremely high degree of alignment properties due to the interaction between the linear molecules.

Being formed by aligning monomolecules, the self-assembled monomolecular film can be made into an extremely thin film and becomes a uniform film at a molecular level. That is, because the same molecules are positioned on the surface of the film, uniform and excellent liquid repellency or the like can be imparted to the surface of the film. If the raw material compounds such as organic silane molecules and a substrate are put into the same airtight container and left for about 2 days to 3 days at room temperature, the self-assembled monomolecular film formed of an organic molecular film or the like is formed on the substrate.

Moreover, if the entire airtight container is kept at 100° C., it takes about 3 hours to form self-assembled monomolecular film on the substrate. Although the aforementioned process is a formation method performed in a gaseous phase, the self-assembled film can also be formed in a liquid phase. For example, if the substrate is dipped in a solution containing the raw material compound and then washed and dried, the self-assembled monomolecular film can be formed on the substrate. In addition, before forming the self-assembled monomolecular film, it is desirable to perform preprocessing by irradiating the substrate surface with ultraviolet light or by washing the substrate with a solvent. By performing the above processing, it is possible to make the substrate surface exhibit uniform liquid repellency.

The present invention is basically constituted as above. Up to now, the pattern forming method, the electronic wiring pattern, the optical device, and the pattern forming apparatus of the present invention have been specifically described. However, the present invention is not limited to the above embodiments. Needless to say, within a scope that does not depart from the gist of the present invention, the present invention can be ameliorated or modified in various ways.

Example 1

Hereinafter, the effects of the present invention will be more specifically described, but the present invention is not limited to the following examples.

In the present example, a material printer including two or more heads was used. Specifically, a printer was used which was prepared by mounting two FUJIFILM Dimatix SX-3 heads (piezoelectric driving-type drop-on-demand ink jet heads (10 pL type) having 128 nozzles of a pitch of 508 μm) on a driving carriage of a material printer "DMP-5005" manufactured by FUJIFILM Dimatix, Inc. U.S.A, and further mounting a metal halide-type UV irradiation device on both sides of the carriage. In the printer, shuttle scanning could be performed according to any shuttle pattern including multipass by control software. The printer had an x stage for correcting inclination (θ) and a y bar for moving the driving carriage in the sub-scanning direction. Moreover, the printer had an alignment adjusting mechanism that reads the alignment marks and adjusts the alignment of the base material based on the read results. Herein, the printer was a sheet-fed type printer.

Hereinafter, one of the two ink jet heads of the driving carriage is referred to as a print head 1 and the other is referred to as a print head 2.

For forming a pattern, an ink A (first ink) was injected into the print head 1, an ink B (UV curable ink (second ink)) was injected into the print head 2. Thereafter, the inks were ejected in the form of droplets to draw a wiring pattern described below, and the droplets were simultaneously irradiated with UV.

Figure 16:
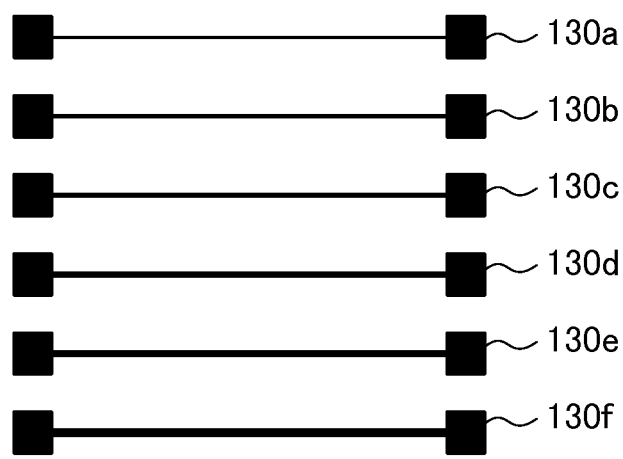
FIG. 16 is a schematic view showing a pattern formed in a first example.

The wiring pattern had pattern portions 130a to 130f shown in FIG. 16 that had a width of 40 μm, a width of 60 μm, a width of 100 μm, a width of 120 μm, a width of 150 μm, and a width of 200 μm respectively. The respective wiring patterns were formed by being arranged vertically, horizontally, and diagonally at an angle of 45° in a single base material.

By a multipass method, a pattern was completed in a pass number of m and at resolution of m×50 dpi by means of swath drawing by shuttle scanning. Moreover, the pattern was superimposed n times on the same place.

As the base material, a transparent biaxially oriented PET base material (film thickness of 175 μm), which had been subjected to a lyophilic processing by a known method, and then coated with an optical lyophilic-lyophobic conversion liquid and dried so as to form a lyophilic-lyophobic conversion film thereon, was used.

Thereafter, the lyophilic-lyophobic conversion film was covered with a glass mask based on a wiring pattern prepared beforehand, and the film was exposed to light at an irradiation amount of 2,000 mJ/cm$^2$ by using an UV irradiation device.

As the glass mask, a chrome-coated glass mask using quartz glass manufactured by MITANI MICRONICS CO., Ltd. was used. As the UV irradiation device, a metal halide lamp was used, and patterning was performed such that a portion exposed to UV light became lyophilic, and a portion not exposed to UV light became lyophobic.

The wiring pattern had the aforementioned pattern portions 130a to 130f shown in FIG. 16. The respective patterns were formed by being exposed to UV light after being arranged vertically, horizontally, and diagonally at an angle of 45° in the single base material. Herein, in the biaxially oriented PET base material, optically readable alignment marks are additionally provided.

As the optical lyophilic-lyophobic conversion liquid, a liquid containing anatase-type titanium dioxide as an inorganic material and containing organopolysiloxane as a binder was used.

Regarding the ink A, a silver nano-ink CCI-300 manufactured by Cabot Corporation was used as an ink A1, and a copper oxide ink was used as an ink A2. Furthermore, as an ink A3, a silver nano-ink SR2000 (solvent-based) manufactured by BANDO CHEMICAL INDUSTRIES, LTD was used.

The copper oxide ink as the ink A2 was prepared in the following manner.

50 g of copper (II) acetate monohydrate was dissolved in a mixed solvent consisting of 50 ml of isobutyric acid, 70 ml of 2-ethoxyethanol, and 20 ml of water by being heated at 130° C. To the solution, 1.5 ml of dodecylamine and 45 ml of the exemplified compound (R-10) were added. The solution was left as is to react for 1 minute and then cooled to room temperature, thereby obtaining a reddish brown colloidal dispersion. As a result of drying the dispersion and performing X-ray diffraction (XRD) analysis, it was confirmed that $Cu_2O$ particles having a mean crystallite size of 14 nm were generated.

To the obtained $Cu_2O$ colloidal dispersion, methanol having a volume 5 times the volume of the dispersion was added, thereby causing precipitation of the $Cu_2O$ nanoparticles. The supernatant liquid was removed by decantation, methanol was added again to the $Cu_2O$ nanoparticles, thereby washing the $Cu_2O$ nanoparticles. This operation was repeated three times, and then the $Cu_2O$ nanoparticles were redispersed in a mixed solvent consisting of 35 ml of 2-ethoxyethanol containing 1 ml of dodecylamine and 15 ml of water, thereby obtaining a $Cu_2O$ fine particle dispersion having a concentration of 25% by mass.

Regarding the ink B, an insulating ink (PMA-1100P-022 (trade name) manufactured by JNC CORPORATION, UV curable ink) was used as an ink B1, and a Uvijet KO ink (UV curable ink) manufactured by FUJIFILM Speciality Ink Systems Ltd. was used as an ink B2.

In the present example, for forming a pattern, the alignment marks of the base material were read and the alignment of the base material was adjusted, and then the ink A and the ink B were simultaneously ejected in the form of droplets to a hydrophilic region and a hydrophobic region respectively by using the aforementioned printer, thereby forming a pattern. The results are shown in Example No. 1 of the following Table 1 and in Example No. 2 of the following Table 2.

In Example No. 1, the ink A1 was used as the ink A, and the UV curable ink B1 was used as the ink B. When being added dropwise to the ink B1, the ink A1 forms a bullet shape. That is, the ink A1 and the ink B1 repel each other.

Moreover, in Example No. 2, the ink A2 was used as the ink A, and the ink B2 was used as the ink B. When being added dropwise to the ink B2, the ink A2 forms a bullet shape. That is, the ink A2 and the ink B2 repel each other.

For comparison, in Example No. 1 and Example No. 2, a pattern was formed by using the aforementioned printer by changing only the pattern forming method. The results are shown in Comparative example No. 1 of the following Table 3 and in Comparative example No. 2 of the following Table 4.

Furthermore, for comparison, after the alignment marks of the base material were read and the alignment of the base material was adjusted, the ink A and the ink B were simultaneously ejected in the form of droplets to a hydrophilic region and a hydrophobic region respectively by using the aforementioned printer, thereby forming a pattern. The results are shown in Comparative example No. 3 of the following Table 5.

In Comparative example No. 3, the ink A3 was used as the ink A, and the ink B2 was used as the ink B. The ink A3 and the ink B2 are not separated from each other. That is, the inks were mixed with each other.

In addition, for comparison, after the alignment marks of the base material were read and the alignment of the base material was adjusted, the ink A was ejected in the form of droplets to a hydrophilic region by using the aforementioned printer, and no ink was ejected in the form of droplets to a hydrophobic region, thereby forming a pattern. The results are shown in Comparative example No. 4 of the following Table 6.

In Comparative example No. 4, only the ink A1 was used, and the ink B was not used.

Regarding the UV exposure of the ink B, the exposure amount was set such that the ink was irradiated with UV light by 1/m to 1/(nm) of the total irradiation amount of the respective inks. The ink B2 that was required to thermally cured finally was thermally cured in the air for a predetermined time and at a predetermined temperature.

Moreover, the ink that was required to be sintered to exhibit conductivity was sintered at a recommended temperature for a recommended time, for example, at 150° C. for 60 minutes.

TABLE 1

| Example No. 1 | Pass number (m) | Number of times of superimposition (n) | Result |
|---|---|---|---|
| 1-A | 10 | 10 | Lines became a pattern at a width of 40 μm to 200 μm. A thickness of 4 μm. |
| 1-B | 10 | 20 | A thickness of 8 μm at a width of 40 μm to 80 μm, a thickness of 8 μm on average at a width of 100 μm to 200 μm. |
| 1-C | 25 | 4 | Lines became a pattern at a width of 40 μm to 200 μm. A thickness of 4 μm. |

TABLE 2

| Example No. 2 | Pass number (m) | Number of times of superimposition (n) | Result |
|---|---|---|---|
| 2-A | 10 | 10 | Lines became a pattern at a width of 40 μm to 200 μm. A thickness of 5 μm. |
| 2-B | 10 | 20 | A thickness of 7 μm at a width of 40 μm to 80 μm, a thickness of 8 μm on average at a width of 100 μm to 200 μm. |
| 2-C | 100 | 1 | Lines became a pattern at a width of 40 μm to 200 μm. A thickness of 4 μm. |

TABLE 3

| Comparative example No. 1 | Pass number (m) | Number of times of superimposition (n) | Result |
|---|---|---|---|
| 1-A | 1 | 1 | Interruption occurred. |

TABLE 4

| Comparative example No. 2 | Pass number (m) | Number of times of superimposition (n) | Result |
|---|---|---|---|
| 2-A | 1 | 1 | Interruption occurred. |

TABLE 5

| Comparative example No. 3 | Pass number (m) | Number of times of superimposition (n) | Result |
|---|---|---|---|
| 3-A | 10 | 1 | A Pattern could be formed. |
| 3-B | 10 | Equal to or greater than 2 | A pattern collapsed (the ink overflowed) without becoming a thick pattern. |

TABLE 6

| Comparative example No. 4 | Pass number (m) | Number of times of superimposition (n) | Result |
|---|---|---|---|
| 4-A | 1 to 10 | 1 | Although lines were formed, the thickness thereof was equal to or less than 0.8 μm. |
| 4-B | A product of the pass number and the number of times of superimposition was equal to or greater than 20. | | Because the ink overflowed, a line could not be formed. |

Herein, the wiring patterns were formed by being arranged vertically, horizontally, and diagonally at an angle of 45° in the single base material. However, from any of the wiring patterns, the same results as shown in Tables 1 to 6 were obtained.

As shown in Tables 1 and 2, 1-A, 1-B, and 1-C of Example No. 1 and 2-A, 2-B, and 2-C of Example No. 2 could form patterns having a film thickness of equal to or greater than 4 μm.

In contrast, Comparative example Nos. 1 and 2 shown in Tables 3 and 4 using different pattern forming methods could not form patterns having a film thickness of equal to or greater than 4 μm.

Moreover, Comparative example Nos. 3 and 4 shown in Tables 5 and 6 using only the ink A1 without the ink B could not form patterns having a film thickness of equal to or greater than 4 μm.

The electrical characteristics (confirmed by measuring a value of resistance) of 1-A and 1-B of Example No. 1 enabled the current of 250 mA to stably flow in the pattern at 12 V.

Moreover, it was confirmed that even when a polyimide base material and an FR-4 base material (glass epoxy base material) were used instead of the transparent biaxially oriented PET base material, the same results as described above were obtained.

Example 2

In the present example, by using the same printer as in Example 1, the conductive pattern 80 shown in FIG. 9 was formed. Herein, the line width of a portion corresponding to the pattern forming region was 40 μm, and each of the interval (pitch) between the first straight lines 96 and the interval (pitch) between the second straight lines 100 was 240 μm.

As the ink A, Cabot CCI-300 (Ag, a polar solvent) and a copper oxide nano-ink were used. As the ink B, an insulating ink (PMA-1100P-022 (trade name) manufactured by JNC CORPORATION) was used.

The copper oxide nano-ink used in the present example is the same as the ink A2 of Example 1. Accordingly, the detail thereof will not be described.

Figure 17:
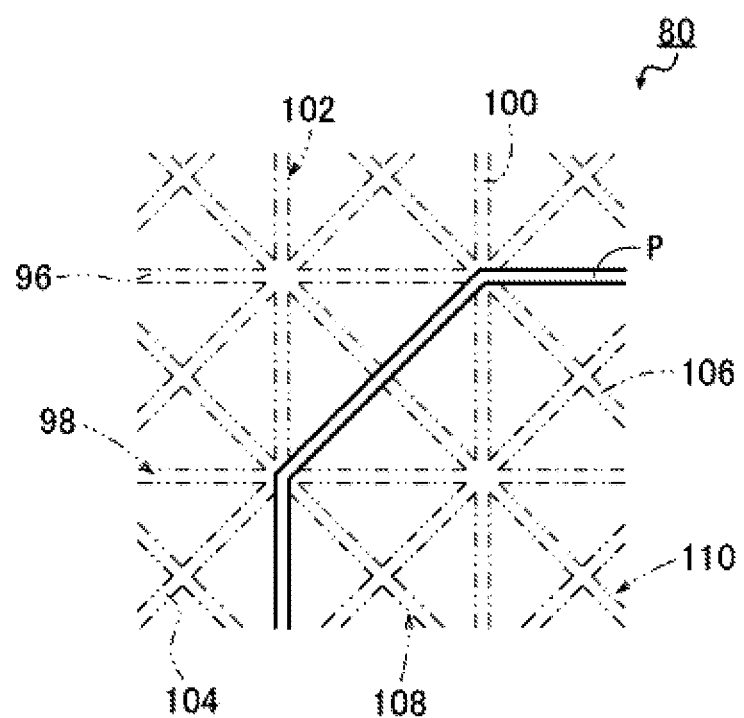
FIG. 17 is a schematic plan view showing a conductive pattern of which the direction is changed by being bent at an obtuse angle.

Herein, for forming a pattern, by using the same printer as in Example 1, the ink A was ejected in the form of droplets as a symbol P shown in FIG. 17, and the ink B was ejected in the form of droplets to other regions, thereby forming a pattern of the symbol P.

For forming a pattern, the ink droplets were cured by UV light by using a metal halide lamp such that ink droplets were irradiated with UV light at an amount of 100 mJ/cm² per pass.

By 25 passes, a pattern having a thickness of 7 μm was obtained. Thereafter, the ink A was ejected in the form of droplets by a pass number enough to fill the void of the pattern forming region at a required film thickness. Then the pattern was sintered, and as a result, it was confirmed that the pattern obtained conductivity.

In addition to the conductive pattern 80 shown in FIG. 9, the conductive pattern 80b shown in FIG. 11 and the conductive pattern 80d shown in FIG. 13 were prepared in the same manner as used for the conductive pattern 80. Even in these cases, it was confirmed that patterns could be formed similarly to the conductive pattern 80 shown in FIG. 9, and the patterns had conductivity.

Example 3

In the present example, by using the same printer as in Example 1, a line-and-space pattern (hereinafter, referred to as "L/S") described below was formed.

In the present example, the surface of a PET base material was irradiated beforehand with a laser beam by using INPREX-3600 manufactured by FUJIFILM Corporation, thereby preparing a lyophilic-lyophobic L/S pattern. Herein, the pitch of L/S was 20 μm.

Thereafter, by using the same printer as in Example 1, an aqueous ink, which was used as the ink A and supported hollow silica particles, and a transparent UV ink (Uvijet WJ Clear Ink manufactured by FUJIFILM Sericol), which was used as the ink B, were simultaneously ejected in the form of droplets to a lyophilic region and a lyophobic region respectively while being irradiated with UV light, at a dense ink ejection amount of 10 pL by using a multipass method (pass number 150). Furthermore, the ink A was additionally ejected in the form of droplets such that the thickness of the dried ink A in the lyophilic region was adjusted to be the same as the thickness of the cured ink B in the lyophobic region.

Finally, the ink droplets were irradiated with UV light at an amount of 500 mJ/cm² such that ink droplets were completely cured. Subsequently, as a result of peeling the formed pattern from the PET base material, a pattern sheet was obtained which had a thickness of 10 μm and in which regions in the form of stripes having different refractive indices were formed. In this way, an optical device can be formed.

What is claimed is:

1. A pattern forming method of ejecting inks in the form of droplets to a base material including a first region and a second region which differ from each other in terms of surface energy by an ink jet method, comprising:
    a preparation step of preparing the base material including the first region and the second region; and
    a droplet ejection step of simultaneously ejecting a first ink and a second ink in the form of droplets to the first region and the second region respectively by using a multipass method,
    wherein the inks are at least two kinds of inks including the first ink having volatility and the second ink having curability,
    the first ink and the first region are lyophilic, and
    the second ink and the second region are lyophilic;
    wherein provided that a width of a narrowest portion of a pattern formed by a first film formed of the first ink and a second film formed of the second ink is p (m), a surface tension of the first ink is $\sigma_1$ (N/m), a film thickness of the first ink is $\delta_1$ (m), and a Hamaker constant determined by the base material and the first ink is $a_{H1}$ (J), the first ink satisfies $\sigma_1 > 0.153 p^{1.947} \times \delta_1^{-3.84} \times |a_{H1}|^{1.022}$.

2. The pattern forming method according to claim 1, wherein the first ink is an ink containing metal particles.

3. The pattern forming method according to claim 1, wherein the second ink is an ultraviolet curable ink or a thermosetting ink.

4. The pattern forming method according to claim 1, wherein the first ink and the second ink repel each other.

5. The pattern forming method according to claim 1, wherein in the droplet ejection step, the droplets of the second ink are cured by performing curing processing on the droplets of the second ink which are ejected before one pass ends.

6. The pattern forming method according to claim 1, wherein in the droplet ejection step, the first ink is ejected in the form of droplets, in an amount not less than 5 times an ejection amount in which the droplets of the first ink are ejected at an interval equal to the diameter of each of the first ink droplets.

7. The pattern forming method according to claim 1, wherein the first film formed of the first ink has a height of equal to or greater than 4 μm.

8. The pattern forming method according to claim 1, wherein the first ink forms a conductive film, and the second ink forms an insulating film.

9. The pattern forming method according to claim 1, further comprising:

a step of forming a film by ejecting the second ink in the form of droplets to the entire surface of the first ink and the second ink.

10. The pattern forming method according to claim 1, wherein the first region has at least a first straight line group consisting of a plurality of first straight lines that extend in a first direction in a state of being parallel to each other and a second straight line group consisting of a plurality of second straight lines that extend in a second direction in a state of being parallel to each other, and grid shapes are formed of the first straight line group and the second straight line group.

11. The pattern forming method according to claim 10, wherein the first region further has a third straight line group consisting of a plurality of third straight lines that extend toward the second straight lines from the first straight lines and are in a position of a diagonal line of each of the grid shapes.

12. The pattern forming method according to claim 11, wherein the first region further has a fourth straight line group consisting of a plurality of fourth straight lines that extend in a position of a diagonal line other than the position of the diagonal line of the third straight lines.

13. The pattern forming method according to claim 10, wherein the first straight line group and the second straight line group have first division lines and second division lines respectively that are formed of the plurality of first straight lines and the plurality of second straight lines arranged on the same axis, and a gap between the first straight lines forming the first division lines is identical to a gap between the second straight lines forming the second division lines.

14. The pattern forming method according to claim 10, wherein at least one of the first straight line group and the second straight line group forms an aggregation in which the first straight lines or the second straight lines extending in a state of being parallel to each other are arranged close together, and a clearance between the first straight lines or the second straight lines forming the aggregation is equal to or less than a diameter of a dot formed by ejection of the first ink, and a clearance between the aggregations adjacent to each other is greater than the diameter of the dot formed by the ejection of the first ink.

15. An electronic wiring substrate comprising wiring formed by the pattern forming method according to claim 1.

16. An optical device formed by the pattern forming method according to claim 1.

17. A pattern forming method of ejecting inks in the form of droplets to a base material including a first region and a second region which differ from each other in terms of surface energy by an ink jet method, comprising:
a preparation step of preparing the base material including the first region and the second region; and
a droplet ejection step of simultaneously ejecting a first ink and a second ink in the form of droplets to the first region and the second region respectively by using a multipass method,
wherein the inks are at least two kinds of inks including the first ink having volatility and the second ink having curability,
the first ink and the first region are lyophilic, and
the second ink and the second region are lyophilic;
wherein provided that a width of a narrowest portion of a pattern formed by a first film formed of the first ink and a second film formed of the second ink is p (m), a surface tension of the second ink is $\sigma_2$ (N/m), a film thickness of the second ink is $\delta_2$ (m), and a Hamaker constant determined by the base material and the second ink is $a_{H2}$ (J), the second ink satisfies $\sigma_2 > 0.153 p^{1.947} \times \delta\delta_2^{-3.84} \times |a_{H2}|^{1.022}$.

* * * * *